(12) United States Patent
Kanamori

(10) Patent No.: US 9,960,064 B2
(45) Date of Patent: May 1, 2018

(54) SUBSTRATE STORING CONTAINER

(71) Applicants: MIRAIAL CO., LTD., Tokyo (JP); SHIN-ETSU POLYMER CO., LTD., Tokyo (JP)

(72) Inventor: Yuta Kanamori, Tokyo (JP)

(73) Assignees: Miraial Co., Ltd., Tokyo (JP); Shin-Etsu Polymer Co., Ltd., Tokyo (JP)

( * ) Notice: Subject to any disclaimer, the term of this patent is extended or adjusted under 35 U.S.C. 154(b) by 157 days.

(21) Appl. No.: 14/898,358

(22) PCT Filed: Jun. 19, 2013

(86) PCT No.: PCT/JP2013/066890
§ 371 (c)(1),
(2) Date: Dec. 14, 2015

(87) PCT Pub. No.: WO2014/203359
PCT Pub. Date: Dec. 24, 2014

(65) Prior Publication Data
US 2016/0148825 A1 May 26, 2016

(51) Int. Cl.
*B65D 85/00* (2006.01)
*H01L 21/673* (2006.01)

(52) U.S. Cl.
CPC .............................. *H01L 21/67383* (2013.01)

(58) Field of Classification Search
CPC .................................................. H01L 21/67376
USPC ....... 206/711, 710, 454, 832, 833, 449, 455, 206/445, 307.1, 722, 723; 211/41.18
See application file for complete search history.

(56) References Cited

U.S. PATENT DOCUMENTS

| | | | | |
|---|---|---|---|---|
| 7,357,257 B2* | 4/2008 | Matsutori | ......... | H01L 21/67373 206/454 |
| 7,410,061 B2* | 8/2008 | Matsutori | ......... | H01L 21/67373 206/454 |
| 7,497,333 B2* | 3/2009 | Matsutori | ......... | H01L 21/67373 206/454 |
| 7,520,388 B2* | 4/2009 | Matsutori | ......... | H01L 21/67373 206/454 |

(Continued)

FOREIGN PATENT DOCUMENTS

| | | |
|---|---|---|
| EP | 1004524 A1 | 5/2000 |
| JP | 2003-200974 A | 7/2003 |

(Continued)

*Primary Examiner* — Jacob K Ackun
*Assistant Examiner* — Jenine Pagan
(74) *Attorney, Agent, or Firm* — Muncy, Geissler, Olds & Lowe, P.C.

(57) ABSTRACT

The lateral substrate support part has: a plurality of plate parts, which have a parallel positional relationship, and support end portions of a plurality of substrates; and a plate-part support part, which supports the plate part, and is fixed to a side wall. The plate-part support part has: a groove-forming portion having a groove formed therein, said groove linearly extending over the whole plate parts in the direction intersecting the plate parts; a protrusion, which is formed in the groove, and which protrudes such that the protrusion reduces the width of the groove in the direction orthogonal to the direction in which the groove extends; and a positioned part that is formed at a center portion of the groove in the direction in which the groove extends.

8 Claims, 24 Drawing Sheets

(56) References Cited

U.S. PATENT DOCUMENTS

| | | | |
|---|---|---|---|
| 8,118,169 B2* | 2/2012 | Hosoi | H01L 21/67369 206/454 |
| 8,365,919 B2* | 2/2013 | Nakayama | H01L 21/67369 206/711 |
| 8,528,738 B2* | 9/2013 | Wiseman | H01L 21/67369 206/454 |
| 2013/0056388 A1 | 3/2013 | Nagashima | |

FOREIGN PATENT DOCUMENTS

| | | |
|---|---|---|
| JP | 2003-300583 A | 10/2003 |
| JP | 2012-212766 A | 11/2012 |
| WO | WO 99/39994 A1 | 8/1999 |
| WO | WO 2011/148450 A1 | 12/2011 |
| WO | WO 2013/025629 A2 | 2/2013 |

* cited by examiner

FIG. 4A
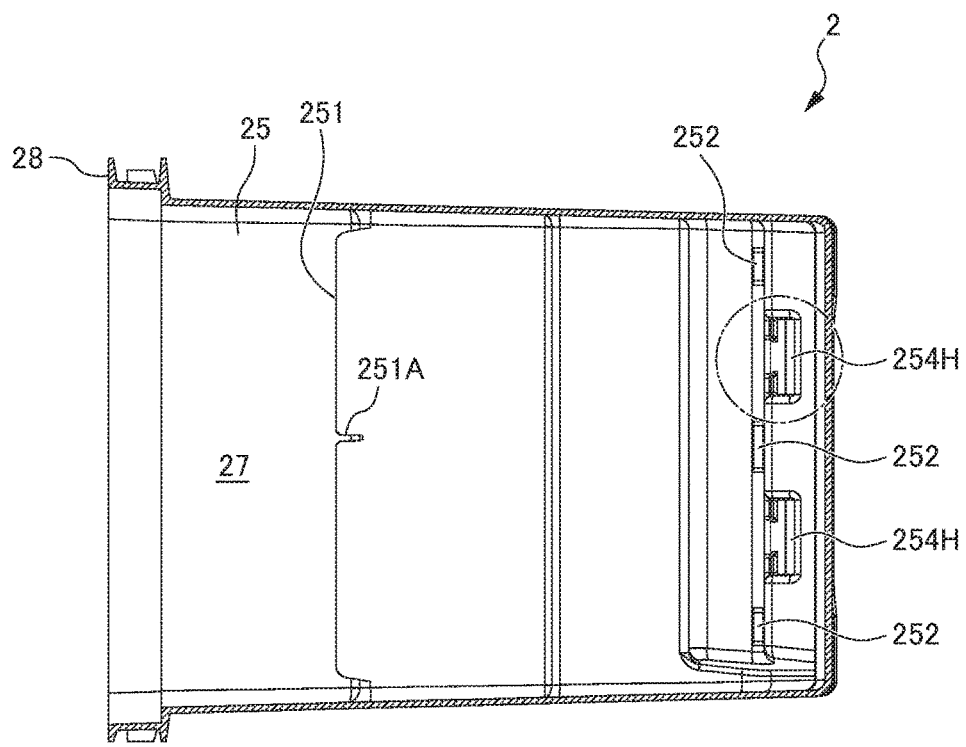
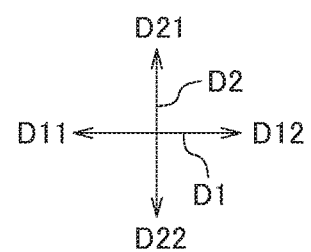

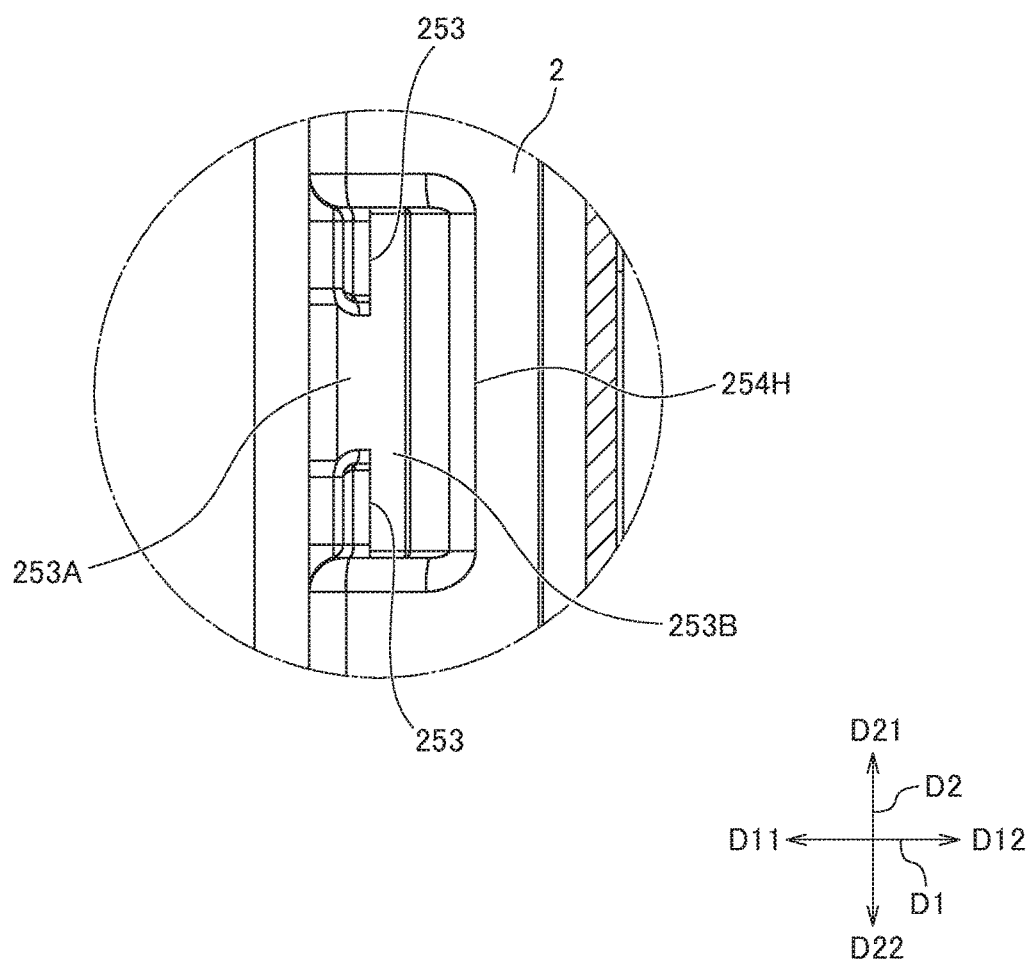

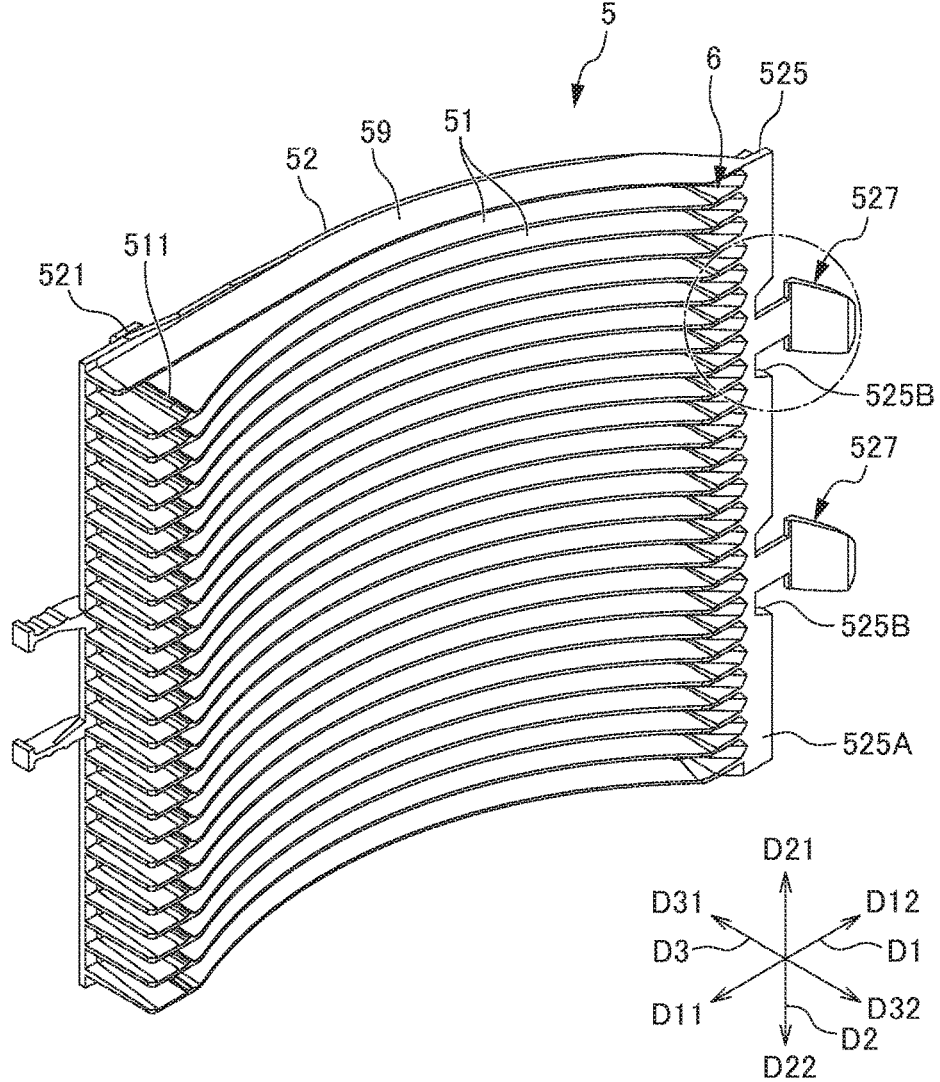

FIG. 7
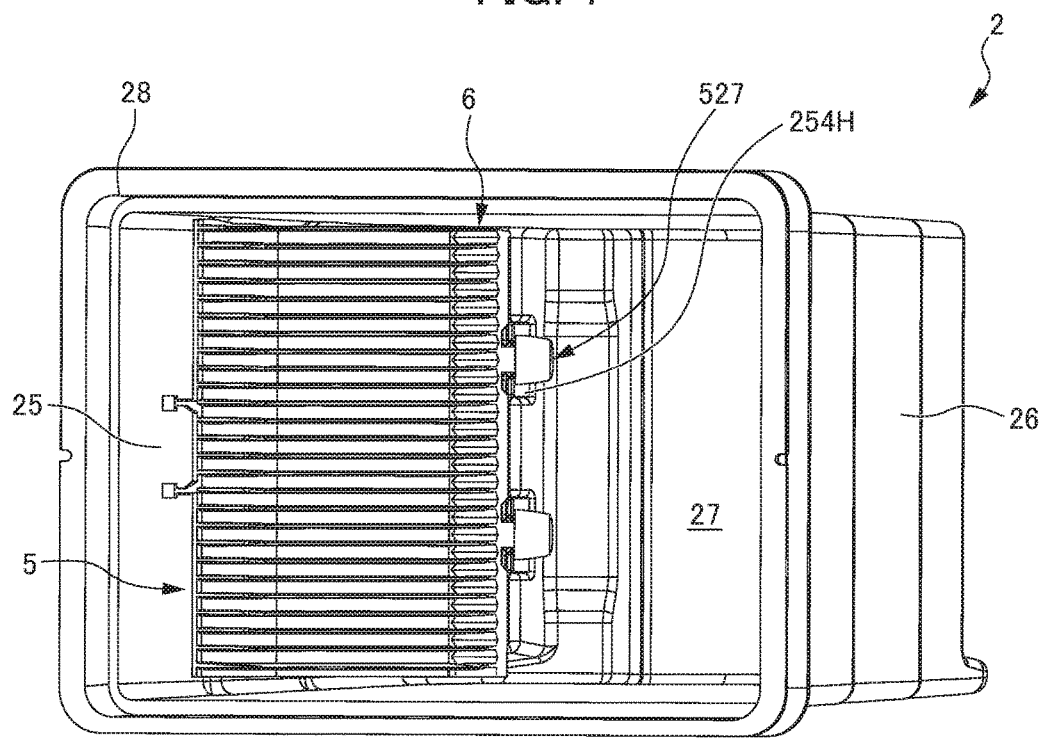
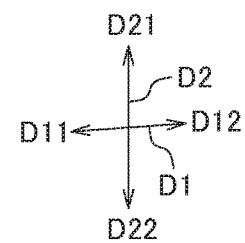

SUBSTRATE STORING CONTAINER

TECHNICAL FIELD

The present invention relates to a substrate storing container that stores substrates such as semiconductor wafers.

BACKGROUND ART

As a container that stores substrates such as semiconductor wafers, containers of a configuration including a container main body, lid body and substrate support plate-like portions have been known conventionally.

The container main body has a cylindrical wall in which a container main body opening portion is formed at one end part, and the other end is closed. A substrate storing space is formed inside of the container main body. The substrate storing space is formed to be surrounded by the wall portion, and can store a plurality of substrates. The lid body is removably attached to the container main body opening portion, and is able to close the container main body opening portion. The substrate support plate-like portions are provided to the wall portion so make a pair inside the substrate storing space. The substrate support plate-like portions can support the edges of a plurality of substrates in a state arranging adjacent substrates in parallel to be separated at a predetermined interval, when the container main body opening portion is not closed by the lid body.

A front retainer is provided to a portion of the lid body facing the substrate storing space when closing the container main body opening portion. The front retainer can support the edges of a plurality of substrates when the container main body opening portion is closed by the lid body. In addition, a back side substrate support portion is provided to the wall portion by configuring to make a pair with the front retainer. The back side substrate support portion can support the edges of a plurality of substrates. The back side substrate support portion retains a plurality of substrates in a state arranging adjacent substrates in parallel to be separated at a predetermined interval, by supporting the plurality of substrates in cooperation with the front retainer, when the container main body opening portion is closed by the lid body.

The wall portion of the container main body has a back wall, upper wall, lower wall, first-side wall and second-side wall. The substrate support plate-like portions are provided in pairs, and are fixed to the first-side wall and second-side wall, respectively, so as to form a pair inside of the substrate storing space. More specifically, holes are formed in the substrate support plate-like portions. The substrate support plate-like portions are fixed to the first-side wall and second-side wall, respectively, by convex portions formed in the first-side wall and second-side wall engaging with the holes in the substrate support plate-like portions.

[Patent Document 1] Pamphlet of PCT International Publication No. WO99/39994

[Patent Document 2] Pamphlet of PCT International Publication No. WO02013/025629.

DISCLOSURE OF THE INVENTION

Problems to be Solved by the Invention

As mentioned above, by the convex portions formed in the first-side wall and second-side wall engaging with the holes in the substrate support plate-like portions, the substrate support plate-like portions are fixed to the first-side wall and second-side wall, respectively; therefore, in the case of deformation having occurred in the substrate support plate-like portions, it has been difficult to sufficiently correct the deformation of the substrate support plate-like portions.

In addition, due to having a configuration in which the convex portions formed in the first-side wall and second-side wall engage with the holes in the substrate support plate-like portions, it has been necessary to mutually adjust the dimensions of the holes and convex portions which engage with each other. In addition, in the case of trying to engage the convex portion not in a hole, but rather in a groove, it has been difficult to fix the substrate support plate-like portions to the first-side wall and second-side wall with high precision.

The present invention has the object of providing a substrate storing container that can sufficiently correct for deformation in substrate support plate-like portions when deformation occurs in the substrate support plate-like portions, and can allow for fixing the substrate support plate-like portions to a first-side wall and second-side wall with high dimensional precision.

Means for Solving the Problems

The present invention relates to a substrate storing container, including: a container main body including a tubular wall portion with a container main body opening portion formed at one end portion and the other end portion closed, the wall portion having a back wall, an upper wall, a lower wall, and a pair of side walls, the container main body opening portion being formed by one end portion of the upper wall, one end portion of the lower wall, and one end portions of the side walls, wherein a substrate storing space that can store a plurality of substrates and is in communication with the container main body opening portion is formed by an inner face of the upper wall, an inner face of the lower wall, inner faces of the side walls, and an inner face of the back wall; a lid body that is removably attached to the container main body opening portion and can close the container main body opening portion; lateral substrate support parts that are disposed to be fixed to the pair of side walls so as to form a pair inside of the substrate storing space, and can support edge parts of a plurality of substrates when the container main body opening portion is not closed by the lid body, in a state in which adjacent substrates among the plurality of substrates are arranged in parallel to be separated by a predetermined interval, wherein the lateral substrate support parts include a plurality of plate parts having a parallel positional relationship and supporting the edge parts of the plurality of substrates; and a plate-part support part that supports the plate part and is fixed to the side wall, in which the plate-part support part includes: a groove forming portion in which a groove that linearly extends over the entirety of the plurality of plate parts in a direction intersecting the plurality of plate parts is formed; a protrusion that is formed inside the groove and projects so as to narrow the width of the groove in a direction orthogonal to an extending direction of the groove, and a positioned part that is formed at a central part of the groove in the extending direction of the groove, and in which a groove-fitting rib part that linearly extends to be able to fit in the groove is present at an inner face of the side wall, and a positioning part that can engage with the positioned part is present at a central part of the groove fitting rib part in an extending direction of the groove-fitting rib part.

In addition, it is preferable for a portion on a back wall side of the side wall to have an back side engagement part, the plate-part supporting part to be configured by a plate-like support wall that is connected to a lateral edge of the plate part from one end to another end in a longitudinal direction of the plate part, the groove forming portion to be present at an opening-side part that is a portion of the support wall on a side of the container main body opening portion, and a back side part that is a portion of the support wall on a side of the back wall to have a back side locked part that can lock with the back side locking part.

In addition, it is preferable for the back side locked part of the plate-part support part to include: a locked-part extending part that is elastically deformable and extends in an opening direction of the groove, and a locked plate part that is formed at an extending end of the locked-part extending part, and is formed to be wider than the locked-part extending part in the extending direction of the groove, and the back side locking part of the side wall to have a narrow-passage forming wall that forms a narrow passage that allows insertion of the locked-part extending portion but does not allow insertion of the locked plate part, and when the locked-part extending part is inserted in the narrow passage, the locked plate part is locked to the narrow-passage forming wall.

In addition, it is preferable for an end of the back side part of the substrate support part to have a flat end face that is parallel to a joining direction of the back wall and the container main body opening portion and a joining direction of the upper wall and the lower wall, and the locked-part extending part to have a positional relationship matching the end face, or is positioned more outwards of the substrate storing space than the end face, without projecting more inwards of the substrate storing space than the end face.

In addition, it is preferable for the locked plate part to have an engagement abutting face that can abut the narrow-passage forming wall when locked to the narrow-passage forming wall.

In addition, it is preferable for an end of the back side part of the substrate support part to have a flat end face that is parallel to a joining direction of the back wall and the container main body opening portion and a joining direction of the upper wall and the lower wall, and the engagement abutting face to have a positional relationship matching the end face, or is positioned more outwards of the substrate storing space than the end face, without projecting more inwards of the substrate storing space than the end face.

In addition, it is preferable for the engagement abutting face to be configured from a sloping face towards the container main body opening portion as approaching inwards of the substrate storing space In addition, it is preferable for a linear rib having a parallel positional relationship with the groove to be present at the support wall to oppose over substantially the entirety of the groove.

Effects of the Invention

According to the present invention, it is possible to provide a substrate storing container that can sufficiently correct for deformation in a substrate support plate-like portion when deformation occurs in the substrate support plate-like portion, and can allow for fixing the substrate support plate-like portions to a first-side wall and second-side wall with high dimensional precision.

BRIEF DESCRIPTION OF THE DRAWINGS

FIG. 4A is a lateral cross-sectional view showing the container main body 2 of the substrate storing container 1 according to the first embodiment of the present invention;

FIG. 4B is a lateral enlarged cross-sectional view showing the container main body 2 of the substrate storing container 1 according to the first embodiment of the present invention;

FIG. 5A is a lateral perspective view showing a substrate support plate-like portion 5 of the substrate storing container 1 according to the first embodiment of the present invention;

FIG. 7 is a lateral perspective view showing an aspect of the substrate support plate-like portion 5 being fixed to a first-side wall 25 of the container main body 2 of the substrate storing container 1 according to the first embodiment of the present invention;

PREFERRED MODE FOR CARRYING OUT THE INVENTION

Figure 1:
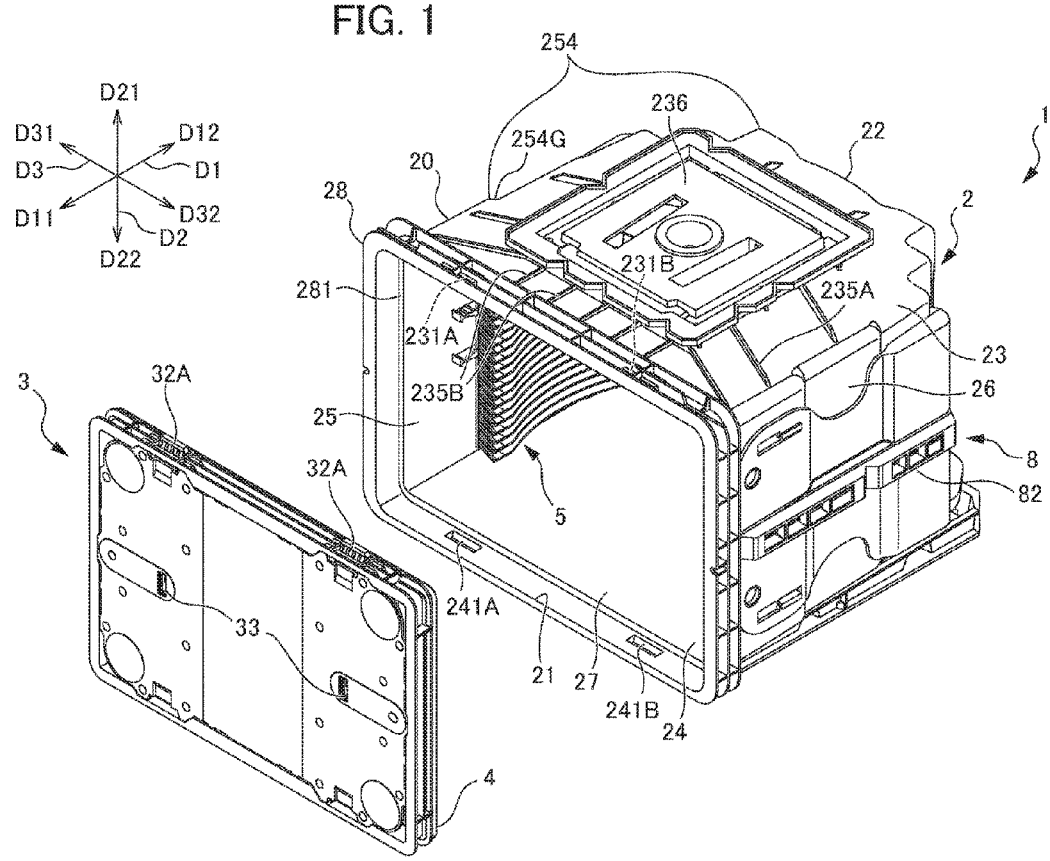
FIG. 1 is a exploded perspective view showing a substrate storing container 1 according to a first embodiment of the present invention.
Figure 2:
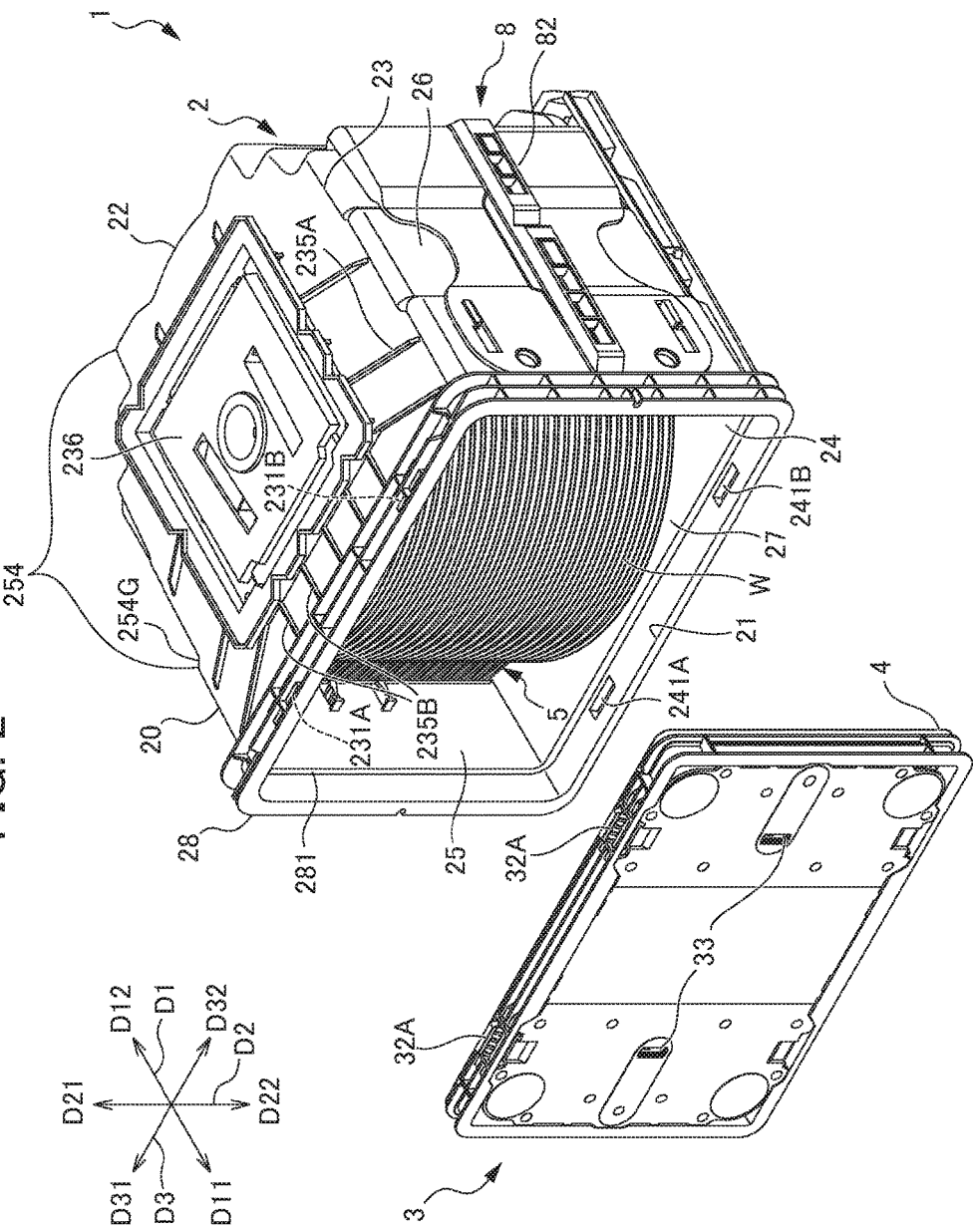
FIG. 2 is a exploded perspective view showing a state storing a substrate W in a substrate storing space 27 of a container main body 2 of the substrate storing container 1 according to the present embodiment.
Figure 3:
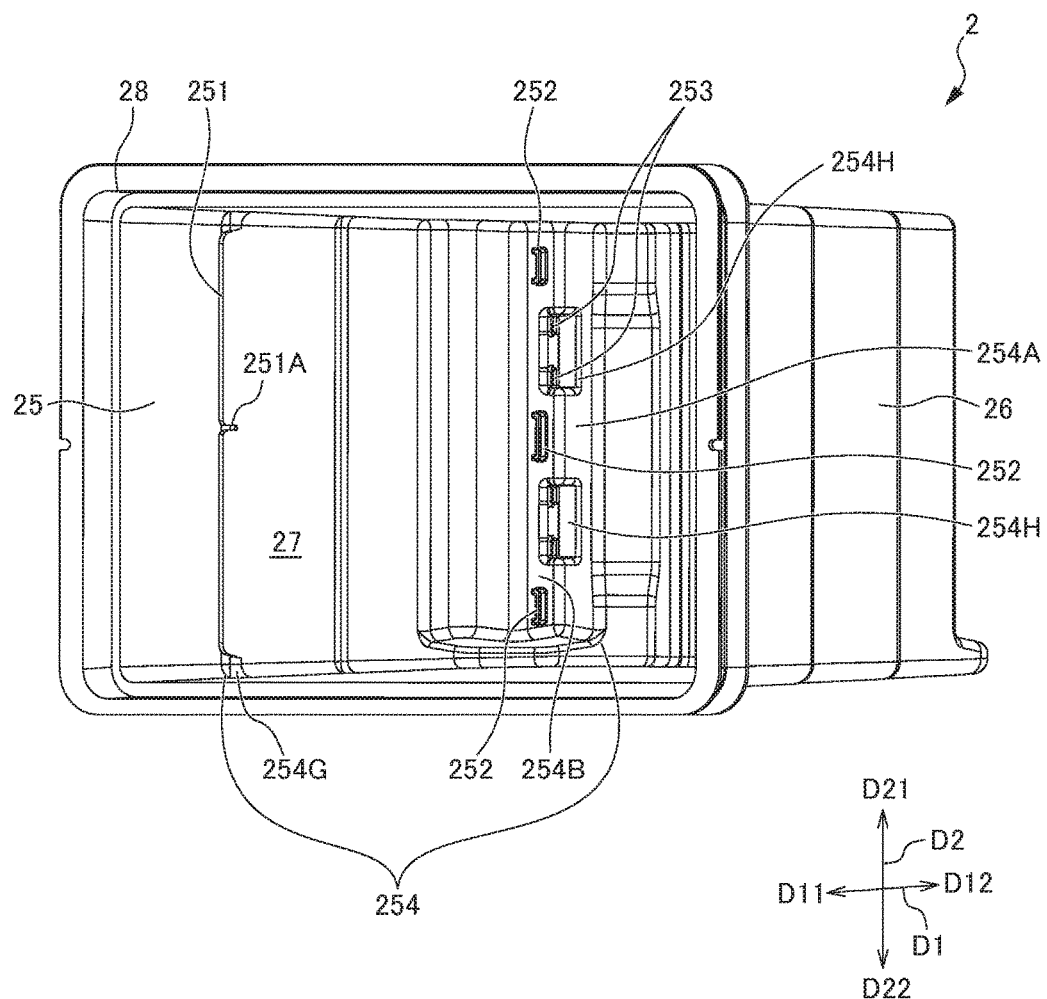
FIG. 3 is a lateral perspective view showing the container main body 2 of the substrate storing container 1 according to the first embodiment of the present invention.

Hereinafter, a substrate storing container 1 according to a first embodiment of the present invention will be explained while referencing the drawings. FIG. 1 is an exploded perspective view showing the substrate storing container 1 according to the first embodiment of the present invention. FIG. 2 is an exploded perspective view showing a state of storing substrates W in a substrate storing space 27 of a container main body 2 of the substrate storing container 1 according to the present embodiment. FIG. 3 is a lateral perspective view showing the container main body 2 of the substrate storing container 1 according to the first embodiment of the present invention. FIG. 4A is a lateral cross-sectional view showing the container main body 2 of the substrate storing container 1 according to the first embodiment of the present invention. FIG. 4B is a lateral enlarged cross-sectional view showing the container main body 2 of the substrate storing container 1 according to the first embodiment of the present invention.

Figure 5B:
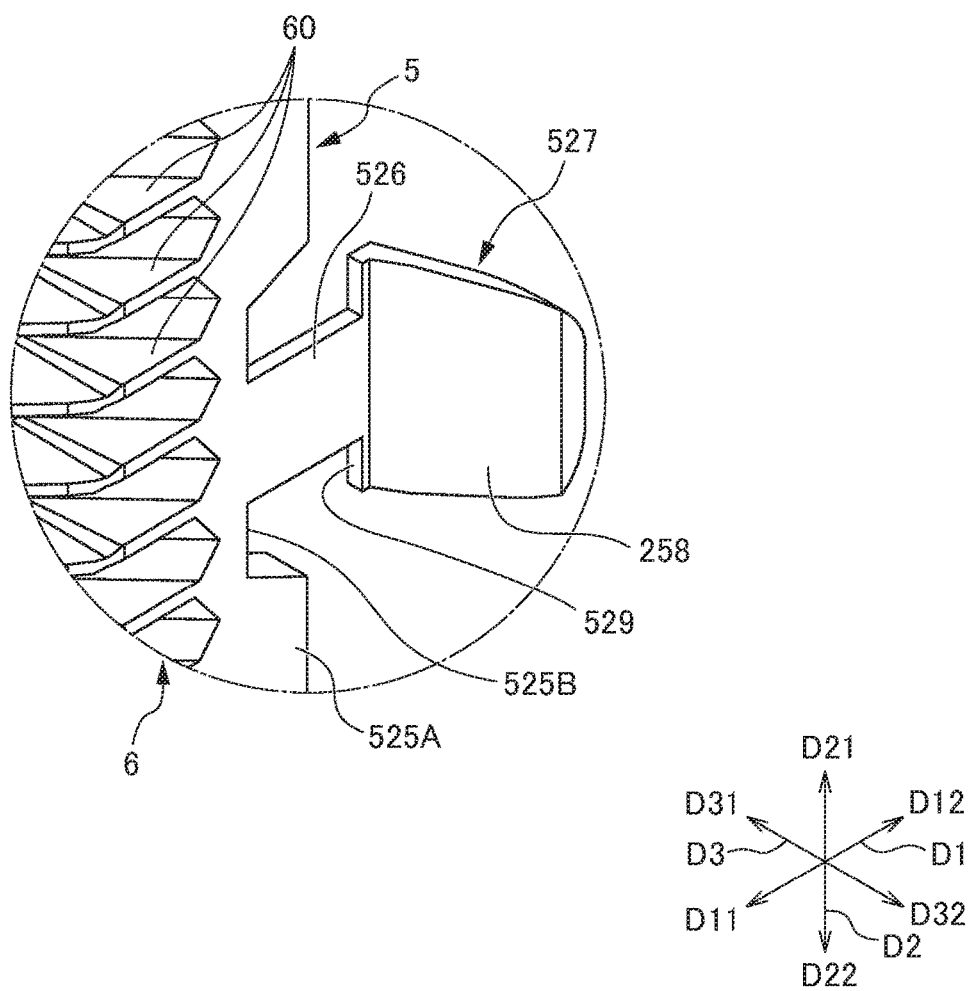
FIG. 5B is an enlarged lateral perspective view showing the substrate support plate-like portion 5 of the substrate storing container 1 according to the first embodiment of the present invention.
Figure 6A:
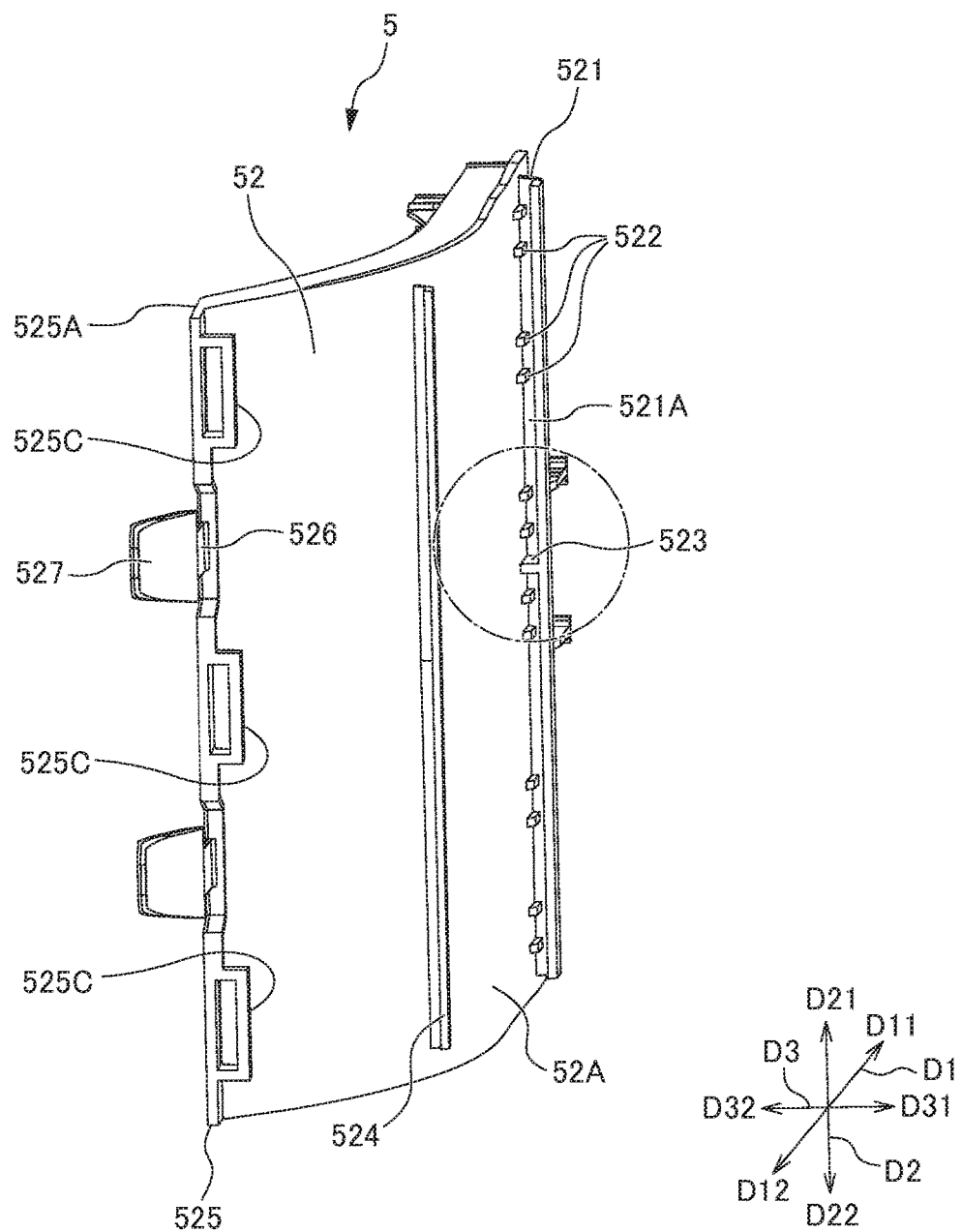
FIG. 6A is a rear perspective view showing the substrate support plate-like portion 5 of the substrate storing container 1 according to the first embodiment of the present invention.
Figure 6B:
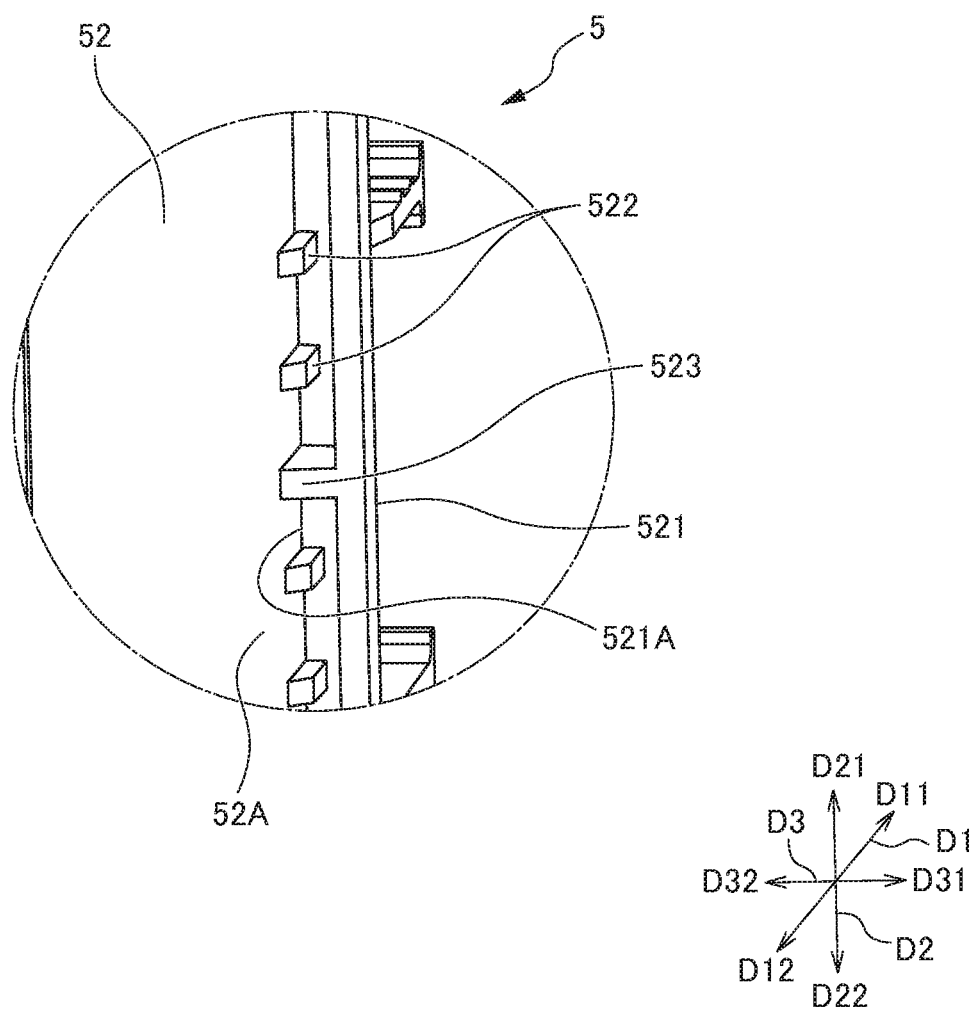
FIG. 6B is an enlarged rear perspective view showing the substrate support plate-like portion 5 of the substrate storing container 1 according to the first embodiment of the present invention.
Figure 6C:
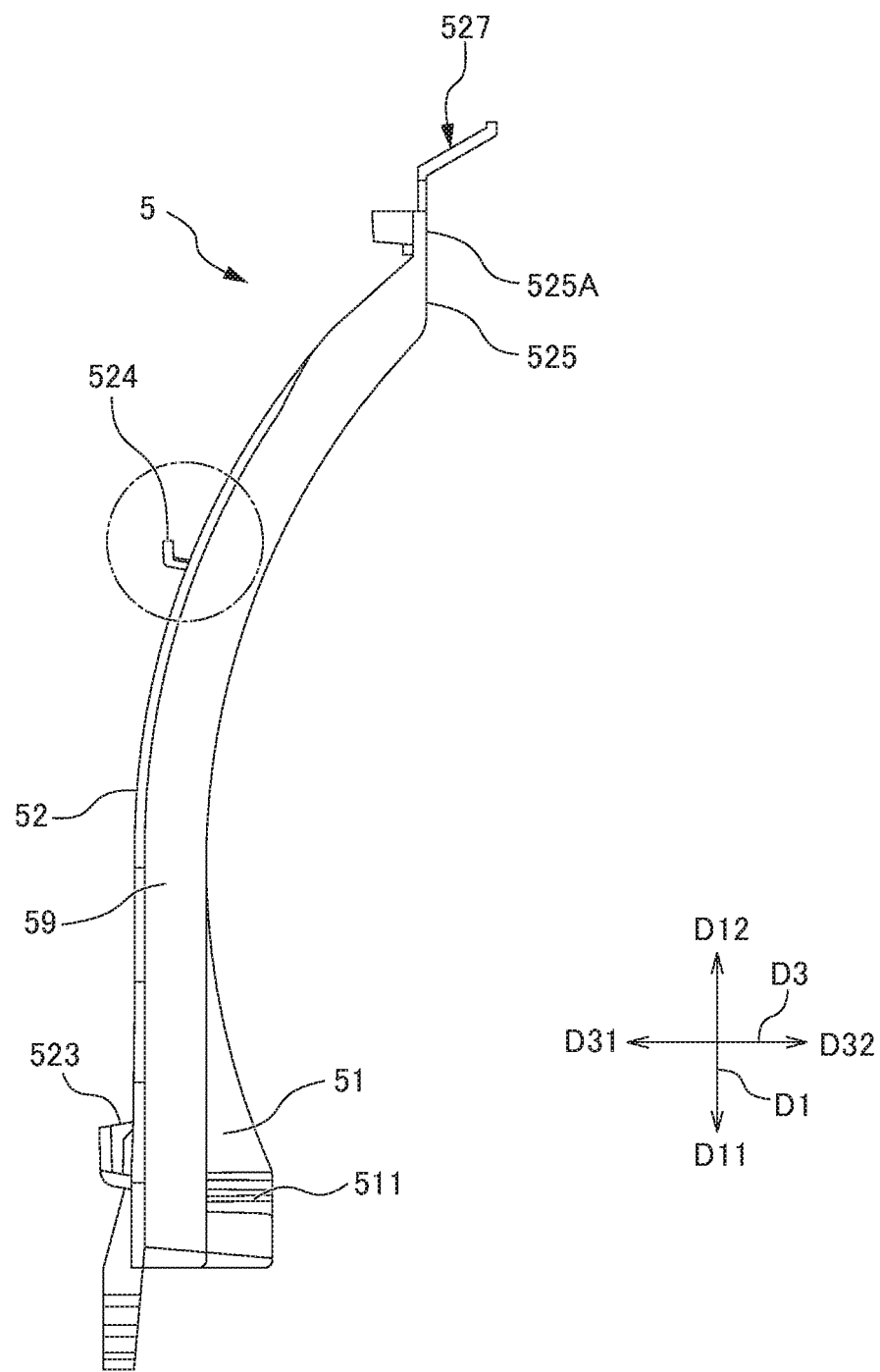
FIG. 6C is a plan view showing the substrate support plate-like portion 5 of the substrate storing container 1 according to the first embodiment of the present invention.
Figure 6D:
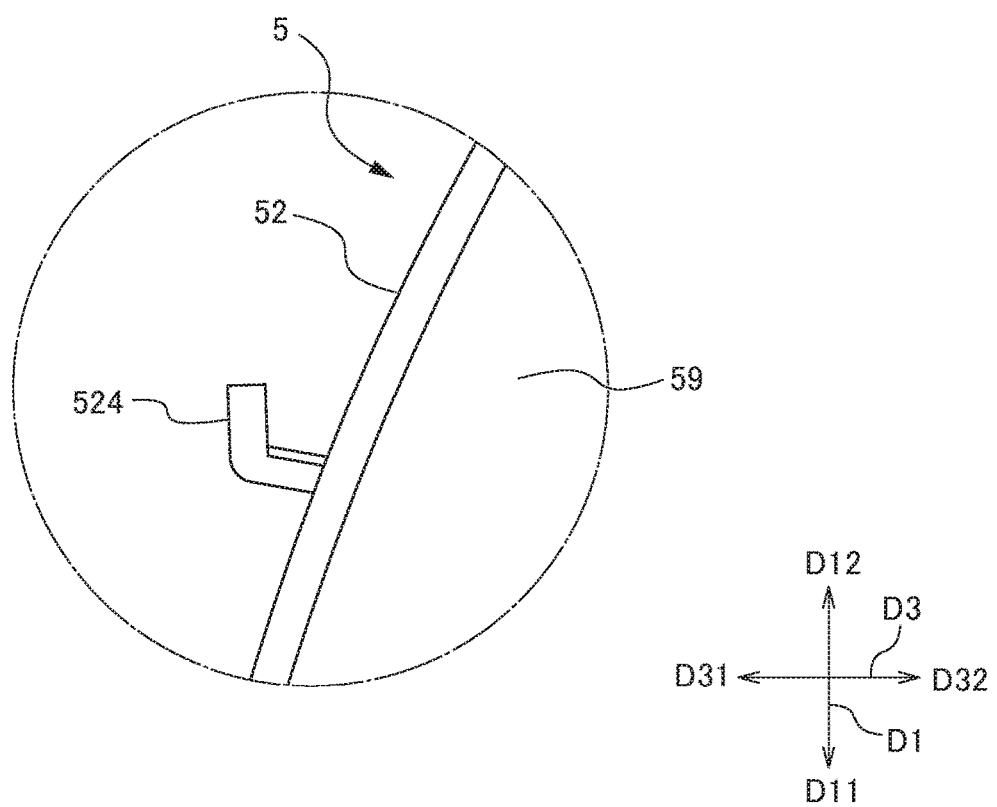
FIG. 6D is an enlarged plan view showing the substrate support plate-like portion 5 of the substrate storing container 1 according to the first embodiment of the present invention.

FIG. 5A is a forward perspective view showing a substrate support plate-like portion 5 of the substrate storing container 1 according to the first embodiment of the present invention. FIG. 5B is an enlarged forward perspective view showing the substrate support plate-like portion 5 of the substrate storing container 1 according to the first embodiment of the present invention. FIG. 6A is a back perspective view showing the substrate support plate-like portion 5 of the substrate storing container 1 according to the first embodiment of the present invention. FIG. 6B is an enlarged back perspective view showing the substrate support plate-like portion 5 of the substrate storing container 1 according to the first embodiment of the present invention. FIG. 6C is a plan view showing the substrate support plate-like portion 5 of the substrate storing container 1 according to the first embodiment of the present invention. FIG. 6D is an enlarged plan view showing the substrate support plate-like portion 5 of the substrate storing container 1 according to the first embodiment of the present invention.

Figure 8A:
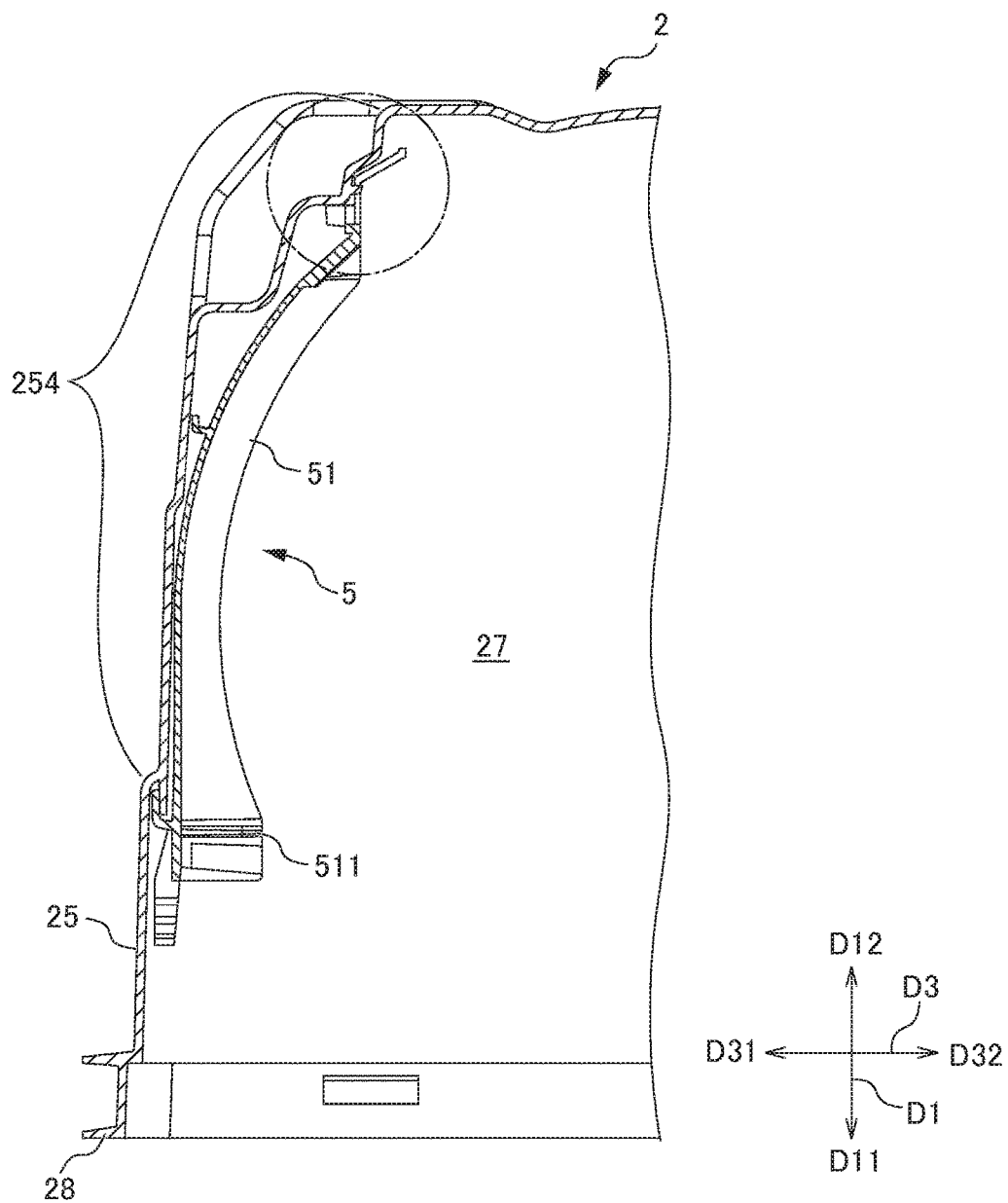
FIG. 8A is a plan cross-sectional view of main portions showing an aspect of the substrate support plate-like portion 5 being fixed to the container main body 2 of the substrate storing container 1 according to the first embodiment of the present invention.
Figure 8B:
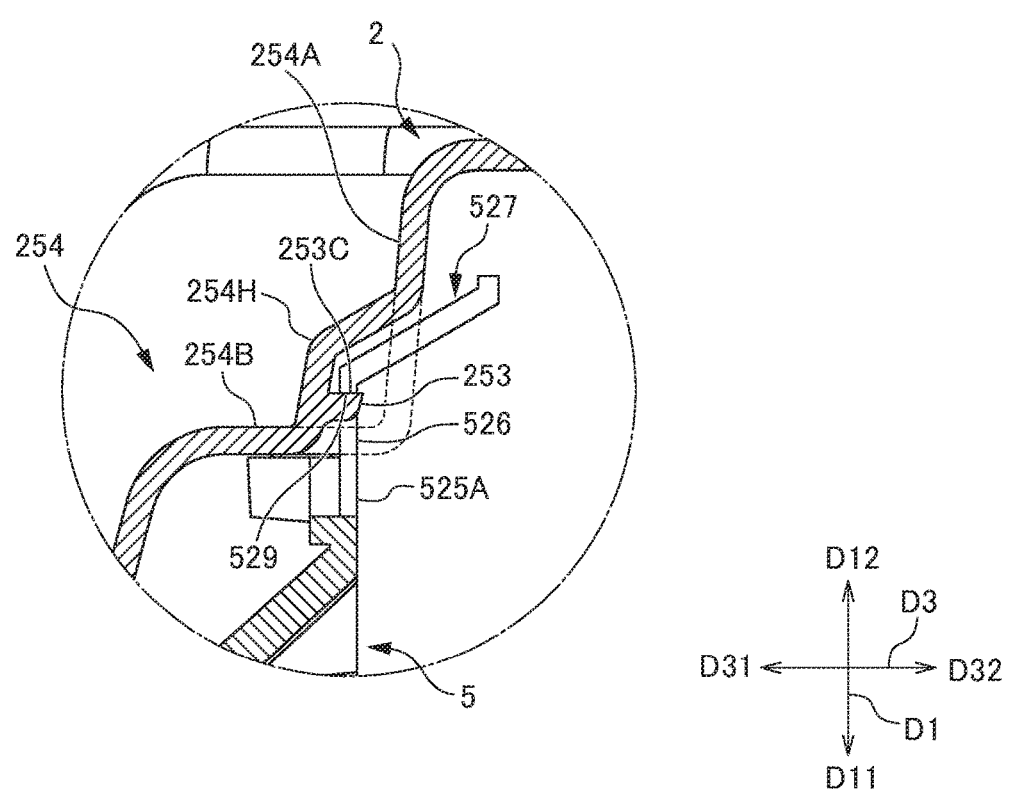
FIG. 8B is a plan enlarged cross-sectional view showing an aspect of the substrate support plate-like portion 5 being fixed to the container main body 2 of the substrate storing container 1 according to the first embodiment of the present invention.

FIG. 7 is a lateral perspective view showing an aspect of the substrate support plate-like portion 5 being fixed to a first-side wall 25 of the container main body 2 of the substrate storing container 1 according to the first embodiment of the present invention. FIG. 8A is a plan cross-sectional view of main portions showing an aspect of the substrate support plate-like portion 5 being fixed to the container main body 2 of the substrate storing container 1 according to the first embodiment of the present invention. FIG. 8B is a plan enlarged cross-sectional view showing an aspect of the substrate support plate-like portion 5 being fixed to the container main body 2 of the substrate storing container 1 according to the first embodiment of the present invention.

Herein, for convenience of explanation, the direction from the container main body 2 to a lid body 3 described later (left downward direction in FIG. 1) is defined as a forward direction D11, the opposite direction thereto is defined as a backward direction D12, and these are defined as the front-back direction D1. In addition, a direction from a lower wall 24 to a upper wall 23 described later (upper direction in FIG. 1) is defined as the upper direction D21, the opposite direction thereto is defined as the lower direction D22, and these are defined as the upper/lower direction D2. In addition, a direction from the second-side wall 26 to the first-side wall 25 described later (left upper direction in FIG. 1) is defined as the left direction D31, the opposite direction thereto is defined as the right direction D32, and these are defined as the left/right direction D3.

In addition, the substrate W stored in the substrate storing container 1 (refer to FIG. 2) is a disc-shaped silicon wafer, glass wafer, sapphire wafer or the like, and is a thin wafer used in industry. The substrate W of the present embodiment is a silicon wafer with a diameter of 450 mm.

As shown in FIG. 1, the substrate storing container 1 includes the container main body 2, lid body 3, and substrate support plate-like portions 5 serving as lateral substrate support parts.

The container main body 2 has a cylindrical wall portion 20 in which a container main body opening portion 21 is formed in one end, and the other end is closed. The substrate storing space 27 is formed inside of the container main body 2. The substrate storing space 27 is formed to be surrounded by the wall portion 20. The substrate support plate-like portion 5 is arranged at a portion of the wall portion 20 forming the substrate storing space 27. As shown in FIG. 2, a plurality of the substrates W can be stored in the substrate storing space 27.

The substrate support plate-like portions 5 are provided to the wall portion 20 so as to form a pair in the left/right direction D3 inside of the substrate storing space 27. The substrate support plate-like portions 5 can support the edges of a plurality of the substrates W in a state arranging the adjacent substrates W in parallel to be separated at a predetermined interval, when the container main body opening portion 21 is not closed by the lid body 3. A back side substrate support portion 6 (refer to FIG. 7, etc.) is provided at the back side of the substrate support plate-like portion 5. The back side substrate support portion 6 can support a rear part of the edges of the plurality of substrates W when the container main body opening portion 21 is closed by the lid body 3.

The lid body 3 is removably attached to the container main body opening portion 21, and can close the container main body opening portion 21. A front retainer (not illustrated) is provided to a portion of the lid body 3 facing the substrate storing space 27 (face on rear side of lid body 3 shown in FIG. 1), when the container main body opening portion 21 is closed by the lid body 3. The front retainer (not illustrated) is arranged so as to form a pair with the back side substrate support portion 6.

The front retainer (not illustrated) can support a front part of the edges of the plurality of substrates W, when the container main body opening portion 21 is closed by the lid body 3. The front retainer (not illustrated) retains the plurality of substrates W in a state arranging the adjacent substrates W in parallel to be separated at a predetermined interval, by supporting the plurality of substrates W in cooperation with the back side substrate support portion 6, when the container main body opening portion 21 is closed by the lid body 3.

As shown in FIG. 1, handling members 8 are provided to the pair of side walls 25, 26 described later that constitute the wall portion 20, to be arranged facing an outer face of the pair of side walls, respectively, so as to follow the outer face of the side walls 25, 26. The substrate storing container 1 can be lifted by a fork lift, by a lower part of ribs 82 of the handling members 8 being supported by the forks of a fork lift (not illustrated). Hereinafter, each part will be explained in detail.

As shown in FIG. 1, the wall 20 of the container main body 2 has the back wall 22, upper wall 23, lower wall 24, first-side wall 25, and second-side wall 26. The back wall 22, upper wall 23, lower wall 24, first-side wall 25, and second-side wall 26 are constituted from a plastic material or the like, and are configured to be integrally molded from polycarbonate in the first embodiment.

The first-side wall 25 and second-side wall 26 are opposing, and the upper wall 23 and lower wall 24 are opposing. A rear end of the upper wall 23, a rear end of the lower wall 24, a rear end of the first-side wall 25 and a rear end of the second-side wall 26 are all connected at the back wall 22. A front end of the upper wall 23, a front end of the lower wall 24, a front end of the first-side wall 25 and a front end of the second-side wall 26 have a positional relationship opposite the back wall 22, and constitute an opening circumferential portion 28 that forms the container main body opening portion 21 assuming a substantially rectangular shape.

The opening circumferential portion 28 is formed at one end of the container main body 2, and the back wall 22 is positioned at the other end of the container main body 2. The external form of the container main body 2 formed by the outer faces of the wall 20 is a box shape. The inner faces of the wall portion 20, i.e. inner face of the back wall 22, inner face of the upper wall 23, inner face of the lower wall 24, inner face of the first-side wall 25 and inner face of the second-side wall 26, form the substrate storing space 27, which is surrounded by these. The container main body opening portion 21 formed at the opening circumferential portion 28 is in communication with the substrate storing space 27 formed inside of the container main body 2, which is surrounded by the wall portion 20. A maximum of twenty-five of the substrates W can be stored in the substrate storing space 27 in the positional relationship in which the top faces and bottom faces of the substrates W are substantially horizontal.

As illustrated in FIG. 1, latch engagement concave portions 231A, 231B, 241A, and 241B, which are concave outwardly from the substrate storing space 27, are formed at portions of the upper wall 23 and the lower wall 24 which are proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, a flange fixing portion (not illustrated) and ribs 235A, 235B are provided so as to be integrally formed with the upper wall 23 at an outer face of the upper wall 23. The flange fixing portion (not illustrated) is arranged at the center portion of the upper wall 23. As illustrated in FIG. 1, a top flange 236 is fixed at the flange fixing portion (not illustrated). The top flange 236 is arranged at the center portion of the upper wall 23. When suspending the substrate storing container 1 by AMHS (Automated Material Handling System), PGV (Person Guided Vehicle), etc., the top flange 236 is hung by an arm of these machines (not illustrated) serving as a suspending member, whereby the substrate storing container 1 is suspended by an arm.

A plurality of the ribs 235A respectively extends in the left-forward direction and right-forward direction from the top flange 236. In addition, a plurality of the ribs 235B extends from the top flange 236 in the forward direction D11, and a plurality extends in the backward direction D12 from the top flange 236.

The first-side wall 25 has a left-right symmetrical shape with the second-side wall 26, only the first-side wall 25 will be explained, and explanation will be omitted for the second-side wall 26. As shown in FIGS. 1 to 3, etc., the first-side wall 25 has a back outer-face recessed portion 254. In addition, as shown in FIG. 3, the first-side wall 25 has a groove-fitting rib part 251, forward convex portion 252, and a narrow-passage forming wall 253 serving as a back side locking part.

As shown in FIGS. 1 and 8A, the back outer-face recessed portion 254 is formed in a step shape so that a distance between the first-side wall 25 and second-side wall 26 in the left/right direction D3 gradually decreases from the opening circumferential portion 28 towards the backward direction D12.

In particular, as shown in FIG. 8A, a portion of the back outer-face recessed portion 254 on the back side (rear side) of the first-side wall 25 is configured so that the outer faces of the pair of side walls 25, 26 are depressed step-wise along the rim of the disc-shaped substrate W (refer to FIG. 2) stored in the substrate storing space 27 (refer to FIG. 1), and the step in the left/right direction D3 is larger at the front side of the first-side wall 25 than a portion of the back outer-face recessed portion 254. The inner face of the back outer-face recessed portion 254 also has a similar step shape as the outer face of the back outer-face recessed portion 254.

As shown in FIG. 4A, the groove-fitting rib part 251 exists at a portion of the inner face of the first-side wall 25, to be about one third of the depth of the container main body 2 in the front-back direction from the opening circumferential portion 28 towards the backward direction D12. A step part 254G (FIG. 3, etc.) positioned the most in the forward direction D11 in the step-shaped back outer-face recessed portion 254 exists in this portion. The groove-fitting rib part 251 projects from a portion of the inner face of the first-side wall 25 inserted inwards of this step part 254G towards the forward direction, and extends linearly in the upper/lower direction D2.

The groove-fitting rib part 251 can fit into a groove 521A described later. The positioning groove 251A serving as a positioning part is formed at a central part of the groove-fitting rib part 251 in the upper/lower direction D2. The positioning groove 251A is formed so as to be notched from a front end that is the projecting end of the groove-fitting rib part 251 towards the backward direction D12, and an alignment rib 523 serving as a positioned part described later can be engaged therewith.

As shown in FIG. 3, etc., a forward convex portion 252 is a part of the step-shaped back outer-face recessed portion 254, and is present at the inner face of a first-step portion 254B from the back wall 22 (portion having a wall face substantially parallel with the back wall 22 (refer to FIG. 8B)). A total of three of the forward convex portions 252 are provided at the upper end vicinity, bottom end vicinity and central part in the upper/lower direction D2 of the back outer-face recessed portion 254. Each of the forward convex portions 252 has a U-shape that is long in the upper/lower direction D2 in a front view, and projects in the forward direction D11. A square-shaped frame part 525C serving as an end engaging part of a support wall 52 described later can engage the forward convex portion 252.

In addition, as shown in FIG. 3, etc., a connecting portion between the first-step portion 254B (refer to FIG. 8B) and a portion 254A from the back wall 22 towards the first-step portion 254B has an outward projecting part 254H that projects outwards of the container main body 2. The inner face of the outward projecting part 254H forms a concave portion depressed outwards of the container main body 2. The outwards projecting parts 254H are formed to make a pair in the upper/lower direction D2. The outward projecting parts 254H are present at a position between an upper forward convex portion 252 and central forward convex portion 252, and at a position between a lower forward convex portion 252 and central forward convex portion 252, among the three forward convex portions 252.

As shown in FIG. 4B, one of the narrow-passage forming walls 253 is present for each of the respective outward projecting parts 254H. The narrow-passage forming walls 253 project from the inner face of the outward projecting part 254H to inwards (right direction D32) of the substrate storing space 27, so as to block about one third of the upper part and about one third of the lower part ahead of the outward projecting part 254H in the vertical direction. A portion between the narrow-passage forming walls 253 forming a pair forms the narrow passage 253A. A space 253B formed by the inner faces of the outward projecting part 254H is in communication via the narrow passage 253A with a portion of the substrate storing space 27 more ahead of the narrow-passage forming wall 253, in the forward direction D11. In a direction towards inwards of the substrate storing space 27 (right direction D32), the space 253B is in communication with portions of the substrate storing space 27 other than the space 253B, without any particular obstructing matter being present.

The substrate support plate-like portions 5 (refer to FIG. 1) are provided to the first-side wall 25 and second-side wall 26, respectively, and arranged inside the substrate storing space 27 by configuring so as to form a pair in the left/right direction D3. More specifically, as shown in FIG. 5A, etc., the substrate support plate-like portions 5 have a plate part 51 and a support wall 52 serving as a plate-part support part.

The plate part 51 and support wall 52 are configured to be integrally molded by resin, whereby the plate part 51 is supported by the support wall 52. The plate part 51 has a plate-shaped substantially arc form. Fifty of the plate parts 51 are provided in the upper/lower direction D2 to the first-side wall 25 and second-side wall 26, respectively, for twenty-five pieces. Adjacent plate parts 51 are arranged in a parallel positional relationship to be separated from each other at an interval of 10 mm to 12 mm in the upper/lower direction D2. It should be noted that, although the plate-like member 59 is arranged in parallel with another one of the plate parts 51 above the plate part 51 positioned the most above, this is a member serving the role of a guide upon insertion to the substrate W being inserted inside the substrate storing space 27 positioned the most above.

In addition, the twenty-five plate parts 51 provided to the first-side wall 25 and the twenty-five plate parts 51 provided to the second-side wall 26 have a positional relationship facing each other in the left/right direction D3. In addition, the fifty plate parts 51 and the member 59 serving the role of a plate-shaped guide parallel to the plate parts 51 have a positional relationship parallel to the inner face of the lower wall 24. As shown in FIG. 5A, a convex portion 511 is provided to the upper face of the plate part 51. The substrate W supported by the plate parts 51 only contacts the projecting end of the convex portion 511, and does not contact the plate part 51 at the face.

A support wall 52 is configured by a plate-like support wall 52 extending in the upper/lower direction D2 and a substantially front-back direction D1, as shown in FIG. 6A. As shown in FIGS. 6A to 6C, the support wall 52 is connected to a side edge of the plate part 51 from one end to the other end in the longitudinal direction of the plate part 51. The plate-like support wall 52 bends to the substrate storing space 27 along an outside edge of the plate part 51.

In other words, the twenty-five plate parts 51 provided to the first-side wall 25 are connected to the support wall 52 provided at the first-side wall 25 side. Similarly, the twenty-five plate parts 51 provided to the second-side wall 26 are connected to the support wall 52 provided at the second-side wall 26 side. The support wall 52 is fixed to the first-side wall 25 and second second-side wall 26, respectively.

The support wall 52 has a groove forming portion 521, protrusion 522, alignment rib 523 as a positioned part, linear rib 524, end face 525A, and locked-part extending part 526 and locked-part plate part 527 as back side locked parts. As shown in FIG. 6A, etc., the groove forming portion 521 is present at a portion (opening side part) of the support wall 52 on a side of the container main body opening portion 21. More specifically, opening side part indicates a vicinity of the front end of the support wall 52, and the groove forming portion 521 is present in a vicinity of this front end of the support wall 52.

In a plan view, the groove forming portion 521 has a substantially L-shape that extends outwards from the substrate storing space 27, bends at a right angle, and then extends rearwards. The groove 521A opening to the backward direction D12 is formed by the groove forming portion 521 and outer face 52A of the support wall 52. The groove 521A extends linearly in a direction orthogonal to the plurality of plate parts 51, more specifically, to the upper/lower direction D2, spanning all of the twenty-five plate parts 51.

A total of twelve of the protrusions 522 are formed inside the groove 521A. In the case of dividing the grooves 521A into upper side and lower side in the upper/lower direction D2, two of the protrusions 522 exist at predetermined intervals for each of the top end, central part and bottom end of the upper side and lower side of the groove 521A, respectively. The protrusions 522 project from the outer face 52A of the support wall 52 forming the groove 521A to outwards of the substrate storing space 27 (left direction D31). The protrusion 522 thereby makes a predetermined width by narrowing the width of the groove 521A in a direction orthogonal to the extending direction of the groove 521A, i.e. left/right direction D3.

As shown in FIG. 6A, the alignment rib 523 is formed at a central part of the groove 521A in the upper/lower direction D2, which is the extending direction of the groove 521A. As shown in FIG. 6B, etc., the alignment rib 523 extends from the groove forming portion 521 until reaching the outer face 52A of the support wall 52, and is formed so as to partition the groove 521A into an upper portion and lower portion. The width of the alignment rib 523 in the upper/lower direction D2 is equal to the width of the positioning groove 251A (FIG. 3, etc.) in the same direction, or smaller than the width of the positioning groove 251A in the same direction. Therefore, the positioning groove 251A allows insertion of the alignment rib 523, and the positioning groove 251A locks the alignment rib 523 by this insertion.

As shown in FIG. 6A, the linear rib 524 is present at a substantially central position in the front-back direction D1 at the outer face 52A of the support wall 52. As shown in FIGS. 6C and 6D, the linear rib 524 has a substantially L-shape in a plan view, extending outwards of the substrate storing space 27, bending at a right angle, and then extending rearwards. The linear rib 524 has a positional relationship parallel to the groove 521A (FIG. 6A) extending in the vertical direction, and is present to oppose over substantially the entirety of the groove 521A.

The end of a back side part of the support wall 52, i.e. end in the backward direction D12 of the support wall 52, has an end wall 525. The end wall 525 has a plate shape having a positional relationship parallel to the front-back direction D1 and upper/lower direction D2. The end wall 525 has an end face 525A that is a face of the end wall 525 on an inner side of the substrate storing space 27. The end face 525A is configured by a flat face that is parallel to the front-back direction D1 that is a direction connecting the back wall 22 and container main body opening portion 21, and the upper/lower direction D2 that is a direction connecting the upper wall 23 and lower wall 24.

As shown in FIGS. 5A, 5B, etc., concave portions 525B depressed in the forward direction D11 are formed at two places above and below in the end wall 525, and the locked-part extending part 526 is present in the concave portion 525B. The locked-part extending part 526 is connected by integrally molding with a portion of the end wall 525 that is forming the concave portion 525B. The locked-part extending part 526 has a positional relationship parallel to the end wall 525, and extends from a portion of the end wall 525 that is constituting the concave portion 525B to the backward direction D12, which is the opening direction of the groove 521A.

The locked-part extending part 526 is elastically deformable so as to swing to a normal vector direction (left/right direction D3) of the end face 525A. The width of the locked-part extending part 526 in the upper/lower direction D2 is smaller than the width of the narrow passage 253A (refer to FIG. 4B) between the narrow-passage forming walls 253 provided as a pair. Therefore, the locked-part extending part 526 can be inserted in this narrow passage 253A. As shown in FIG. 8B, etc., the locked-part extending part 526 does not project more inwards (right direction D32) of the substrate storing space 27 than the end face 525A. The face on the inner side of the substrate storing space 27 of the locked-part extending part 526 (right end face of locked-part extending part 526 in FIG. 8B) has a positional relationship matching the end face 525A (flush positional relationship).

As shown in FIG. 5B, the locked plate part 527 is connected by forming to be integrally molded with the extending end of the locked-part extending part 526. The locked plate part 527 extends slightly from the extending end of the locked-part extending part 526 in the extending direction of the locked-part extending part 526 (backward direction D12), folds and extends inwards of the substrate storing space 27, and further folds and slightly extends in the backwards direction D12. As shown in FIG. 5B, the locked plate part 527 is formed to be wider in width than the locked-part extending part 526 in the upper/lower direction D2, which is the extending direction of the groove 521A. For this reason, the width of the locked plate part 527 in the upper/lower direction D2 is larger than the width of the narrow passage 253A between the narrow-passage forming walls 253 making a pair (refer to FIG. 4B). Therefore, the locked plate part 527 cannot be inserted in the narrow passage 253A. A wide plate-like portion 528 of the locked plate part 527 has a substantially plate shape that is substantially trapezoidal as a whole, and the width of the locked plate part 527 in the upper/lower direction D2 becomes smaller so that the locked plate part 527 tapers off slightly in the extending direction of the plate-like portion 528 of the locked plate part 527.

Upper and lower portions of a portion of the locked plate part 527 connected to the extending end of the locked-part extending part 526, i.e. front end of the locked plate part 527, has an engagement abutting face 529. The engagement abutting face 529 has a positional relationship parallel to the upper/lower direction D2 and left/right direction D3, as shown in FIG. 8B. The engagement abutting face 529 surface abuts the face 253C on the backward direction D12 side of the narrow-passage forming wall 253, when the support wall 52 is fixed to the first-side wall 25, by the locked plate part 527 being locked to the narrow-passage forming wall 253, as described later. The engagement abutting face 529 is positioned more outwards of the substrate storing space 27 than the end face 525A, without projecting more inwards of the substrate storing space 27 than the end face 525A, as shown in FIG. 8B, etc.

As shown in FIG. 6A, three square-shaped frame parts 525C in which rectangular through-holes are respectively formed exist at the back end of the end wall 525. The three square-shaped frame parts 525C are positioned at equal intervals in the upper/lower direction D2, and the through-holes of the square-shaped frame parts 525C open in the front-back direction D1. The forward convex portions 252 (refer to FIG. 3, etc.) can each be inserted into the through-holes of the square-shaped frame parts 525C.

The substrate support plate-like portions 5 of the above such configuration are fixed to the first-side wall 25 and second-side wall 26, and the substrate support plate-like portions 5 can support the edges of a plurality of the substrates W in a state separating adjacent substrates W among the plurality of the substrates W by a predetermined interval and in a state establishing a positional relationship parallel to each other.

The back side substrate support portion 6 has a wall-portion substrate support portion 60, as shown in FIG. 5B. The wall-portion substrate support portion 60 is molded integrally with the plate part 51 and support wall 52, at the back end of the plate parts 51 of the substrate support plate-like portion 5 and the back end of the support wall 52. It should be noted that the back side substrate support portion 6 may be configured to be a separate body from the substrate support plate-like portion 5, i.e. the wall-portion substrate support portion 60 may be configured to be a separate body from the plate part 51 and support wall 52 of the substrate support plate-like portion 5.

A number of the wall-portion substrate support portions 60 corresponding to every one of the substrates W storable in the substrate storing space 27 is provided, i.e. twenty-five. The wall-portion substrate support portions 60 provided to the first-side wall 25 and second-side wall 26 have a positional relationship so as to form pairs with the front retainer (not illustrated) described later, in the front-back direction D1. By the substrates W being stored inside the substrate storing space 27, and the lid body 3 being closed, the wall-portion substrate support portions 60 sandwich the end edges of the edges of the substrates W.

As shown in FIG. 1, the lid body 3 has a substantially rectangular shape that substantially matches the shape of the opening circumferential portion 28 of the container main body 2. The lid body 3 is removably attached to the opening circumferential portion 28 of the container main body 2, and the lid body 3 can seal the container main body opening portion 21 by the lid body 3 being mounted to the opening circumferential portion 28. A ring-like sealing member 4 is attached to a face that faces a face of a step portion (sealing face 281) formed at a position which is at an inner face of the lid body 3 (a back side face of the lid body 3 illustrated in FIG. 1), and is slightly in the backward direction D12 from the opening circumferential portion 28 when the lid body 3 closes the container main body opening portion 21. The sealing member 4 is made of elastically deformable POE (polyoxyethylene) or PEE, or alternatively made of various types of thermoplastic elastomer such as polyester and polyolefin, fluorine containing rubber, silicon rubber, etc. The sealing member 4 is arranged so as to go around the circumferential edge portion of the lid body 3.

When the lid body 3 is mounted to the opening circumferential portion 28, the sealing member 4 elastically deformed by being sandwiched between the sealing face 281 and lid body 3, whereby the lid body 3 closes in a state hermetically sealing the container main body opening portion 21. By the lid body 3 being detached from the opening circumferential portion 28, the substrates W can be placed in or removed from the substrate storing space 27 inside of the container main body 2.

A latching mechanism is provided at the lid body 3. The latching mechanism is provided in the vicinity of both left and right end portions of the lid body 3. As illustrated in FIG. 1, the latching mechanism includes two upper side latch portions 32A which can project from the upper side of the lid body 3 in the upper direction D21 and two lower side latch portions (not illustrated) that can project from the lower side of the lid body 3 in the lower direction D22. The two upper side latch portions 32A are arranged in the vicinity of both left and right ends of the upper side of the lid body 3 and the two lower side latch portions are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portion 32A and the lower side latch portion (not illustrated) to project from the upper side and the lower side of the lid body 3 as well as possible to make enter a state not projecting from the upper side and the lower side of the lid body 3. By the upper side latch portion 32A projecting from the upper side of the lid body 3 in the upper direction D21 to engage with the latch engagement concave portions 231A and 231B of the container main body 2 and the lower side latch portion projecting from the lower side of the lid body 3 in the lower direction D22 to engage with the latch engagement concave portions 241A and 241B of the container main body 2, the lid body 3 is fixed to the opening circumferential portion 28 of the container main body 2.

The concave portions (not illustrated) depressed outwards of the substrate storing space 27 are formed at the inside of the lid body 3. The front retainer (not illustrated) is provided to be fixed to the concave portion (not illustrated) and a portion of the lid body 3 on the outside of the concave portion.

The front retainer includes a front retainer substrate receiving portion (not illustrated). The front retainer substrate receiving portion is arranged in two pieces to be spaced apart by a predetermined interval in the left/right direction D3 so as to form a pair. The front retainer substrate receiving portions arranged in two pieces so as to form a pair as above are provided such that twenty-five pieces thereof are arranged in parallel in the upper/lower direction D2. By the substrates W being stored in the substrate storing space 27 and the lid body 3 being closed, the front retainer substrate receiving portion sandwiches and supports end edges of the edge portions of the substrates W.

In the substrate storing container 1 of the above-mentioned configuration, the attaching and detaching of the substrate support plate-like portion 5 relative to the first-side wall 25 is performed in the following way.

When mounting the substrate support plate-like portion 5 to the first-side wall 25, first, it is configured so as to make the alignment rib 523 (refer to FIG. 6B) insert into the positioning groove 251A (refer to FIG. 3), and then at the same time as fitting the groove fitting rib part 251 (refer to FIG. 3) into the groove 521A (refer to FIG. 6B), the forward convex portion 252 is closely arranged at the through-hole of the square-shaped frame part 525C to be able to insert the forward convex portion 252 (refer to FIG. 3) into the through-hole of the square-shaped frame part 525C (refer to FIG. 6A). Then, the back part of the support wall 52 is pressed in the left direction D31 so as to approach the first-side wall 25, while elastically deforming the locked-part extending part 526 (refer to FIG. 5B) so as to bend inwards of the substrate storing space 27 (right direction D32 in FIG. 8B).

The edge of the engagement abutting face 529 (refer to FIG. 8B) surpasses the edge in the extending direction of the narrow-passage forming wall 253. Then, by the locked plate part 527 being locked to the narrow-passage forming wall 253, i.e. by the back side part that is a portion of the support wall 52 on the back wall side being locked to the back side locking part, the support wall 52 is fixed to the first-side wall 25. At this time, as shown in FIG. 8B, the engagement abutting face 529 surface abuts the face 253C on a side in the backward direction D12 of the narrow-passage forming wall 253. In addition, the locked-part extending part 526 is inserted in the narrow passage 253A. In addition, the forward convex portions 252 (refer to FIG. 3) are inserted into the through-holes of the square-shaped frame parts 525C (refer to FIG. 6A).

When detaching the substrate support plate-like portion 5 from the first-side wall 25, first, the back part of the support wall 52 is pulled back inwards of the substrate support space 27, while elastically deforming so as to bend the locked-part extending part 526 (refer to FIG. 8B) inwards of the substrate storing space 27 (right side D32 in FIG. 8B). The edge of the engagement abutting face 529 thereby surpasses the edge in the extending direction of the narrow-passage forming wall 253. By the locked plate part 527 leaving from the narrow-passage forming wall 253, i.e. the portion of the support wall 52 on the back wall side (back side part) leaving from the narrow-passage forming wall 253 serving as the back side locking part, the fixing of the support wall 52 to the first-side wall 25 is thereby released.

At this time, the forward convex portions 252 leave from the through-holes of the square-shaped frame parts 525C. Then, by detaching groove fitting rib part 251 from the groove 521A to release the fitting, the substrate support plate-like portion 5 is detached from the first-side wall 25.

The following such effects can be obtained by the substrate storing container 1 according to the first embodiment of the above-mentioned configuration.

As mentioned earlier, the support wall 52 has the groove forming portion 521 in which the groove 521A extending linearly over the entirety of a plurality of plate parts 51 in a direction orthogonal to the plurality of plate parts 51 is formed, and the groove fitting rib part 251 extending linearly to be able to fit the groove 521A is present at an inner face of the first-side wall 25.

For this reason, it is possible to correct for deformation, for example, warping, etc. due to mold contraction of the substrate support plate-like portion 5 as a forward substrate support part by making to follow the groove fitting rib part 251 of the container main body 2, which has little deformation, and thus it is possible to improve the assembly precision of members supporting the substrates W.

In addition, the support wall 52 has the alignment rib 523 as a positioned part formed at a central part of the groove 521A in the extending direction of the groove 521A, and the positioning groove 251A serving as a positioning part that can lock the positioned part is present at a central part of the groove fitting rib part 251 in the extending direction of the groove fitting rib part 251.

For this reason, compared to a case of positioning based on an end in the extending direction of the groove 521A, it is possible to make the dimensional error in the pitch direction between the plurality of plate parts 51 at both ends of the groove 521A to be ½ by locking the alignment rib 523 by the positioning groove 251A. As a result thereof, in the case of a configuration fixing the support wall to the container main body by fitting pins and holes as is conventionally, it has been necessary to adjust pins and holes, respectively, for the dimensions of each of the pins and holes; however, such adjustment can be made unnecessary.

In addition, the substrate support plate-like portion 5 has the protrusions 522 formed inside the groove 521A and projecting so as to narrow the width of the groove 521A in a direction orthogonal to the extending direction of the groove 521A. For this reason, it is possible to finely adjust the position of the substrate support plate-like portion 5 relative to the first-side wall 25 by adjusting the projecting amount of the protrusion 522. In addition, in the case of rattling occurring at the substrate support plate-like portion 5 relative to the first-side wall 25, it is possible to eliminate the rattling by adjusting the projecting amount of the protrusions 522.

In addition, the groove forming portion 521 is present at an opening side part that is a portion of the support wall 52 on the container main body opening portion side, and the back side part that is a portion of the support wall 52 on the back wall side has the back side locked part that can lock to the back side locking part. Then, the back side locked part has the locked-part extending part 526 that is elastically deformable and extends in the opening direction of the groove 521A, and the locked plate part 527 that is formed at the extending end of the locked-part extending part 526, and formed to be wider in width than the locked-part extending part 526 in the extending direction of the groove 521A. In addition, the back side locking part of the first-side wall 25 has the narrow-passage forming wall 253 that forms the narrow passage 253A that allows insertion of the locked-part extending part 526, but does not allow insertion of the locked plate part 527.

For this reason, when the locked-part extending part 526 is inserted in the narrow passage 253A, it is possible to lock the locked plate part 527 to the narrow-passage forming wall 253. Then, by being locked in this way, a portion of the support wall 52 on the back wall side is locked to the back side locking part. For this reason, it is possible to lock the support wall 52 to the first-side wall 25 at the back side and opening side part of the support wall 52.

In addition, the locked-part extending part 526 has a positional relationship matching the end face 525A without projecting more inwards of the substrate storing space 27 than the end face 525A; therefore, even in a case of the substrate support plate-like portion 5 being stretched in a direction from the back side to the opening side, which is a direction in which the substrate support plate-like portion 5 is detached from the first-side wall 25 (forward direction D11), it is possible to make the locked plate part 527 hardly move inwards of the substrate storing space 27, which is the direction in which the locking of the locked plate part 527 to the narrow-passage forming wall 253 is released. As a result thereof, it is possible to make the substrate support plate-like portion 5 serving as a lateral substrate support part to hardly disconnect from the first-side wall 25.

In addition, when the locked plate part 527 is locked to the narrow-passage forming wall 253, due to having the engagement abutting face 529 that can abut the narrow-passage forming wall 253, it is possible to stabilize locking of the locked plate part 527 to the narrow-passage forming wall 253.

In addition, the engagement abutting face 529 is positioned more outwards of the substrate storing space 27 than the end face 525A, without projecting more inwards of the substrate storing space 27 than the end face 525A. For this reason, even in a case of the substrate support plate-like portion 5 being stretched in a direction from the back side to the opening side, which is the direction in which the substrate support plate-like portion 5 is detached from the first-side wall 25 (forward direction D11), it is possible to make the locked plate part 527 hardly move inwards of the substrate storing space 27, which is the direction in which locking of the locked plate part 527 to the narrow-passage forming wall 253 is released. As a result thereof, it is possible to make the substrate support plate-like portion 5 serving as a lateral substrate support part from disconnecting from the first-side wall 25.

In addition, the linear rib 524 having a parallel positional relationship with the groove 521A is present to oppose over substantially the entirety of the groove 521A on the support wall 52. For this reason, it is possible to raise the strength of the support wall 52 serving as a plate-part support part over the entirety of the pitch direction between the plurality of plate parts 51.

Figure 9A:
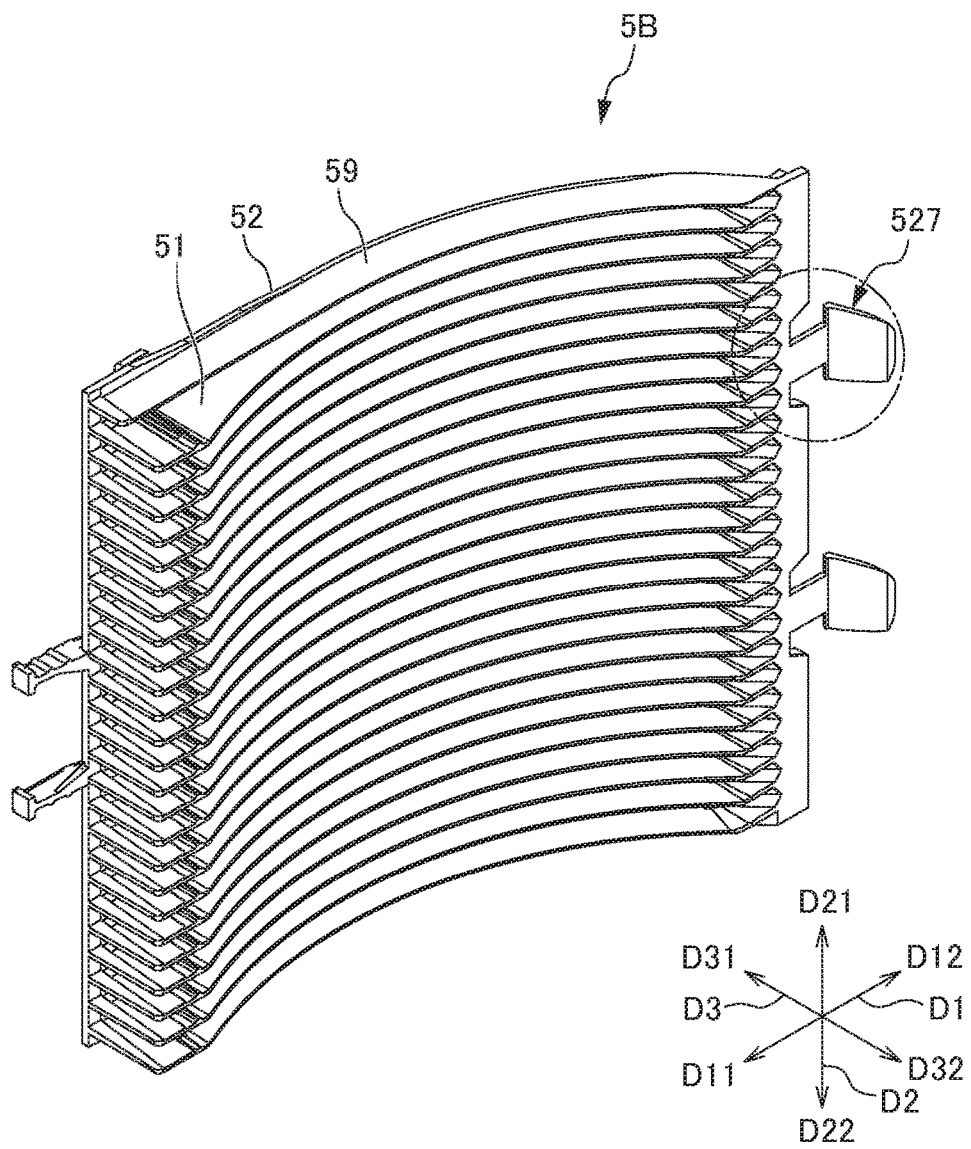
FIG. 9A is a lateral perspective view showing a substrate storage plate part 5B of a substrate storing container according to a second embodiment of the present invention.
Figure 9B:
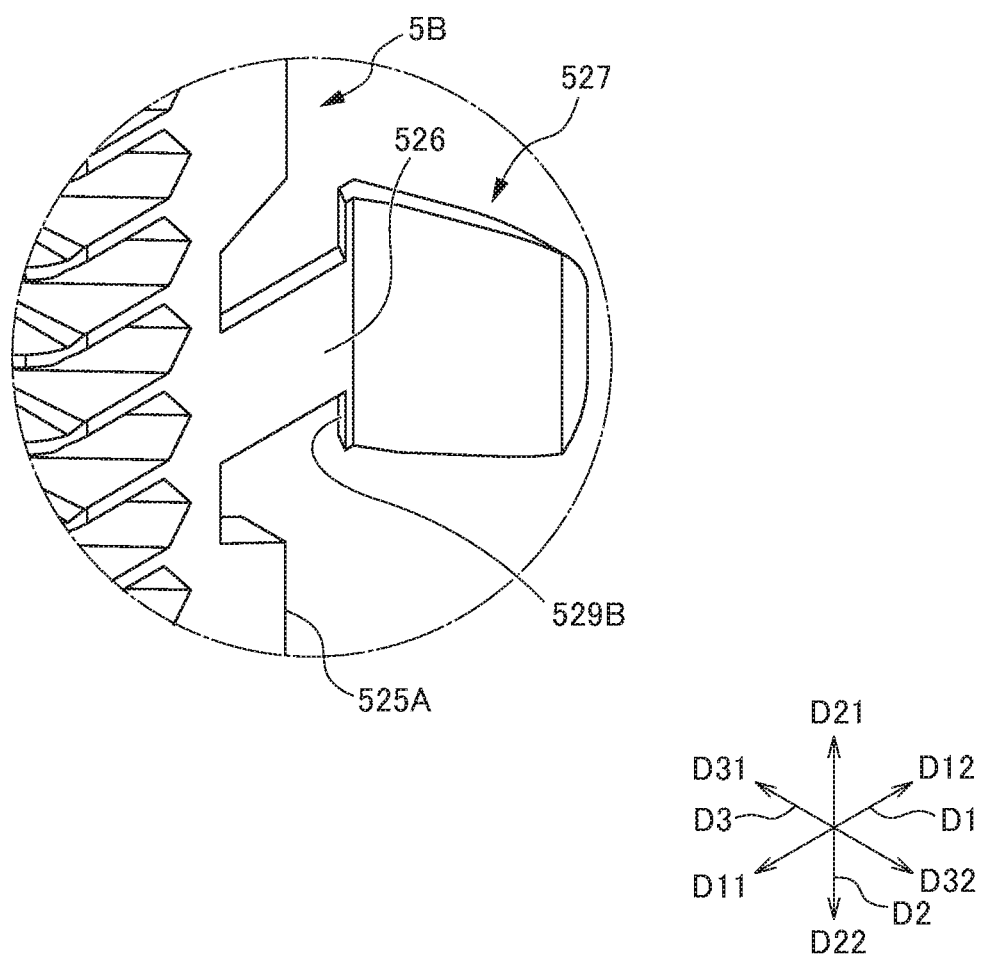
FIG. 9B is an enlarged front perspective view showing the substrate support plate-like portion 5B of the substrate storing container according to the second embodiment of the present invention.
Figure 9C:
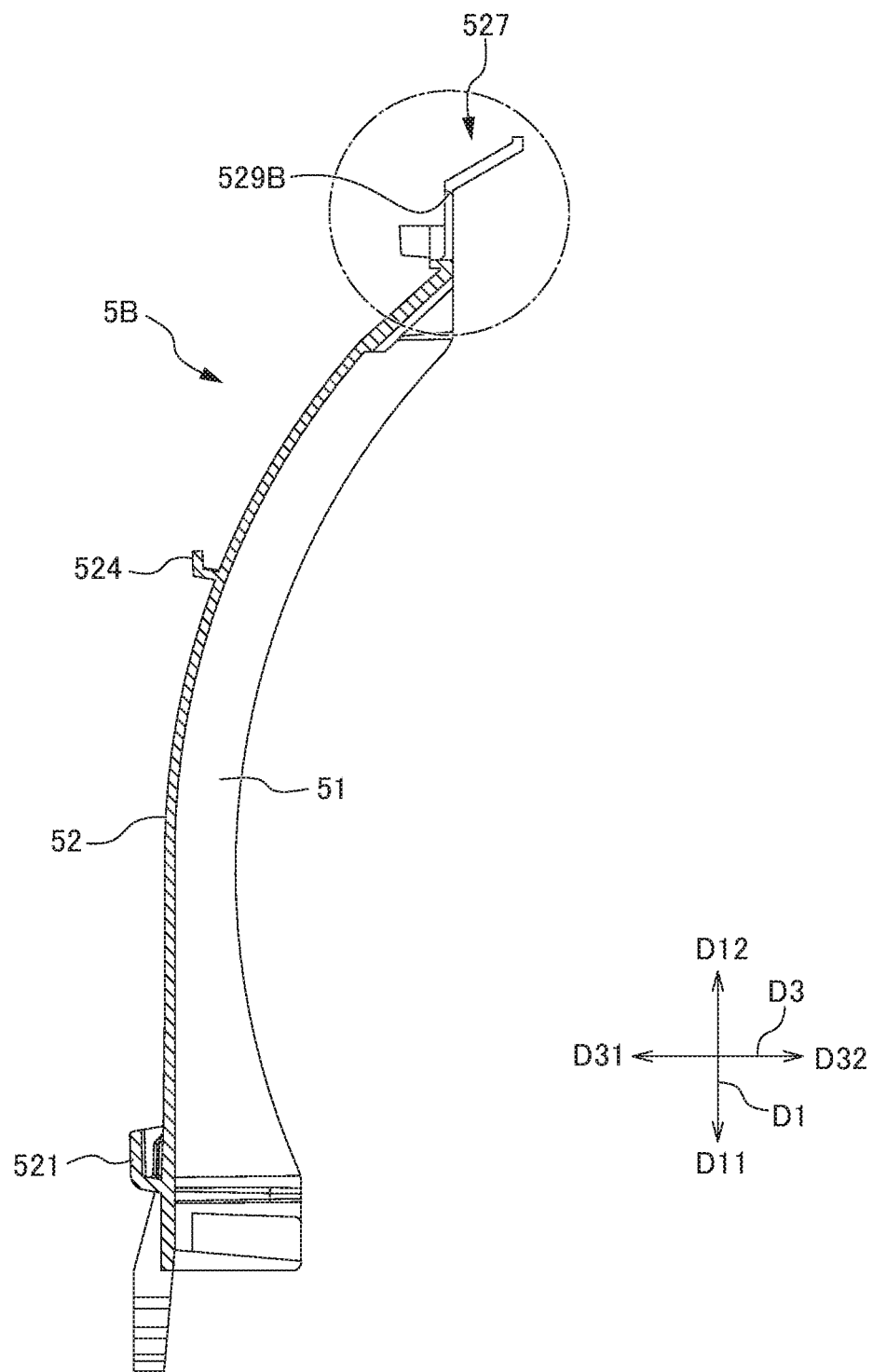
FIG. 9C is a plan cross-sectional view showing the substrate support plate-like portion 5B of the substrate storing container according to the second embodiment of the present invention.
Figure 9D:
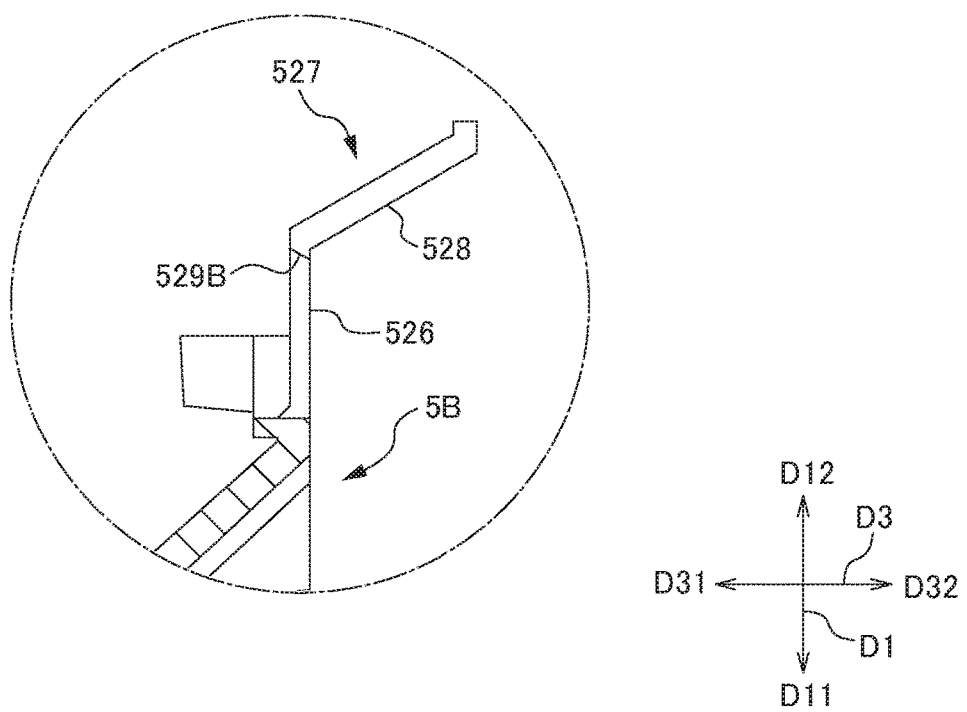
FIG. 9D is an enlarged plan cross-sectional view of a locked-part extending part 526 and a locked plate part 527 of the substrate support plate-like portion 5B of the substrate storing container according to the second embodiment of the present invention.
Figure 10A:
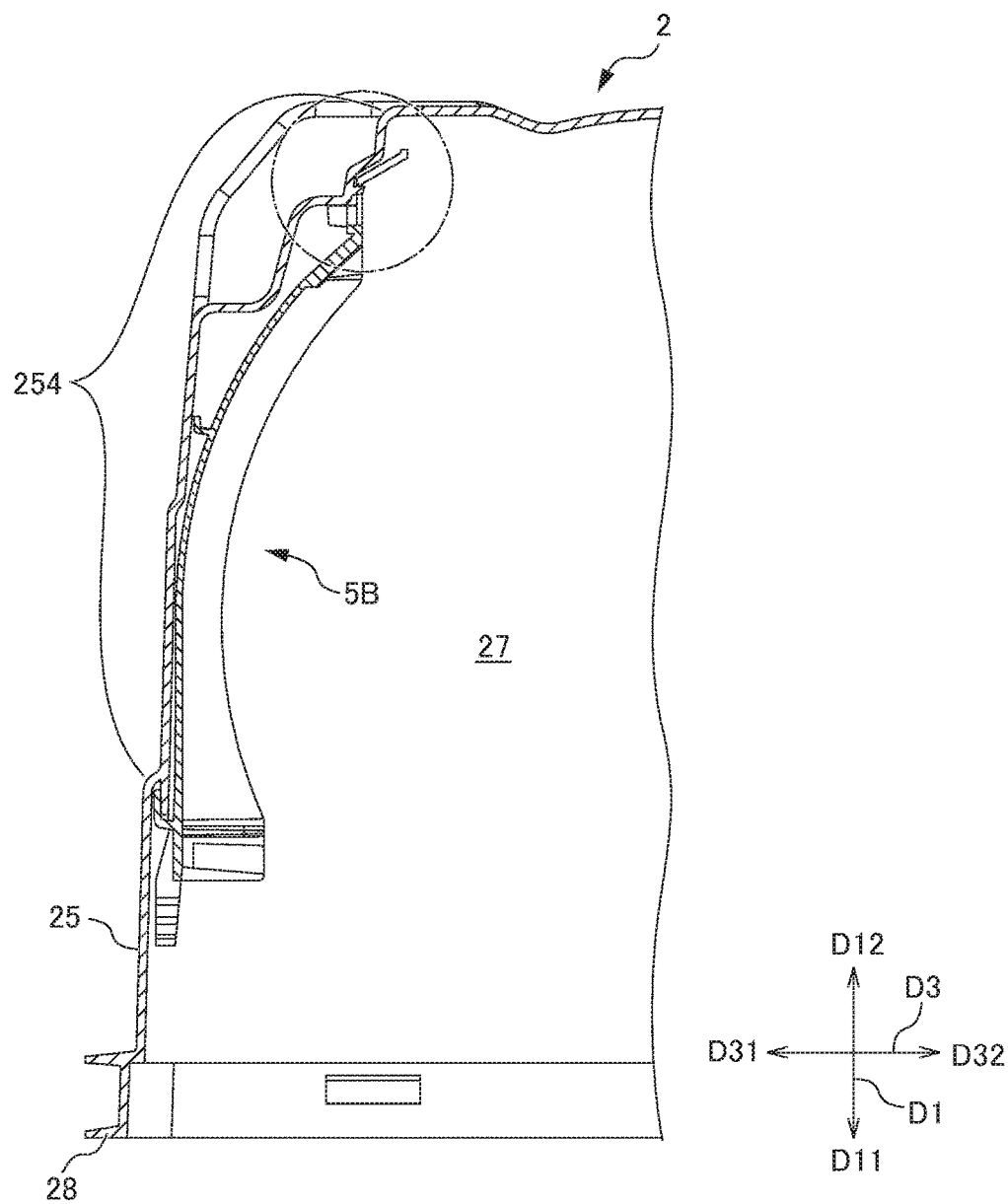
FIG. 10A is a plan cross-sectional view of main portions showing an aspect of the substrate support plate-like portion 5B being fixed to the container main body 2 of the substrate storing container according to the second embodiment of the present invention.
Figure 10B:
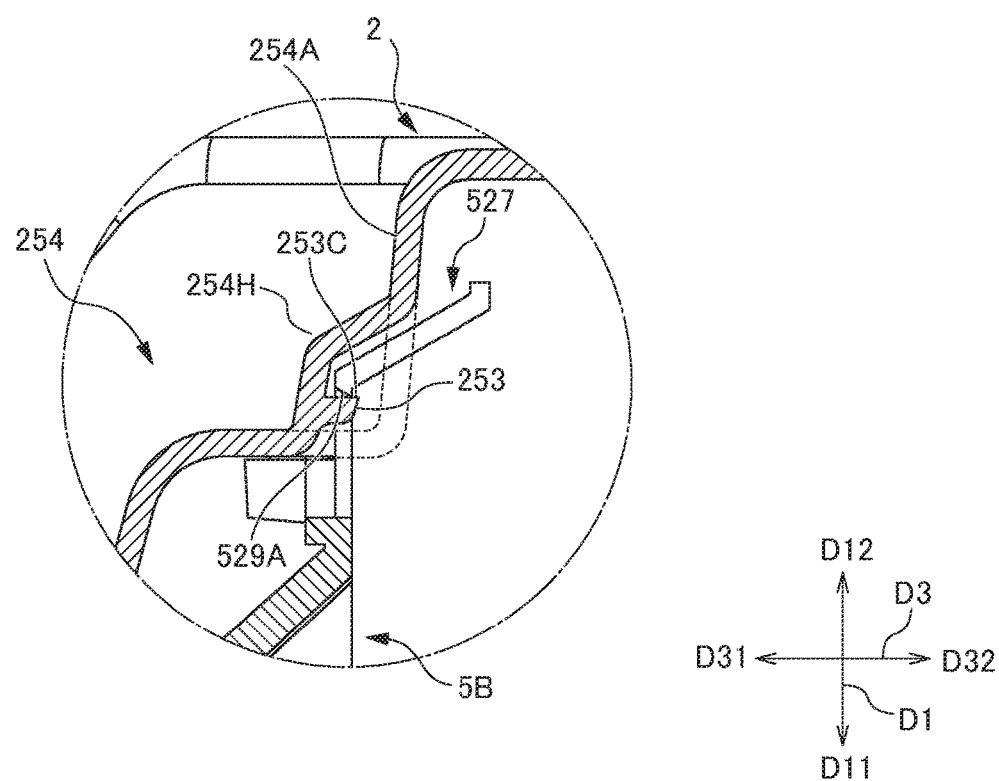
FIG. 10B is a plan enlarged cross-sectional view showing an aspect of the substrate support plate-like portion 5B being fixed to the container main body 2 of the substrate storing container according to the second embodiment of the present invention.

Next, a substrate storing container according to a second embodiment of the present invention will be explained by referencing FIGS. 9A to 10B. FIG. 9A is a front perspective view showing a substrate support plate-like portion 5B of the substrate storing container according to the second embodiment of the present invention. FIG. 9B is an enlarged front perspective view showing the substrate support plate-like portion 5B of the substrate storing container according to the second embodiment of the present invention. FIG. 9C is a plan cross-sectional view showing the substrate support plate-like portion 5B of the substrate storing container according to the second embodiment of the present invention. FIG. 9D is an enlarged plan cross-sectional view showing a locked-part extending part 526 and locked-part plate part 527 of the substrate support plate-like portion 5B of the substrate storing container according to the second embodiment of the present invention. FIG. 10A is a plan cross-sectional view of main portions showing an aspect of the substrate support plate-like portion 5B being fixed to the container main body 2 of the substrate storing container according to the second embodiment of the present invention. FIG. 10B is a plan enlarged cross-sectional view showing an aspect of the substrate support plate-like portion 5B being fixed to the container main body 2 of the substrate storing container according to the second embodiment of the present invention.

The substrate storing container according to the second embodiment differs from the substrate storing container 1 according to the first embodiment in the point of the direction of an engagement abutting face 529B of the substrate support plate-like portion 5B differing. Configurations similar to the respective configurations of the first embodiment are assigned similar reference symbols, and explanations are omitted.

As understood when referencing FIG. 10B while comparing with FIG. 8B, the engagement abutting face 529B is configured by a flat sloping face (flat sloping face towards forward direction D11) towards the container main body opening portion 21 as approaching inwards of the substrate storing space 27 (right direction D32). Therefore, in the engagement abutting face 529B, what is abutting the face 253C on the side in the backward direction D12 of the narrow-passage forming wall 253 is only the edge on the inward side of the substrate storing space 27 (edge on right direction D32 side).

The following such effects can be obtained by the substrate storing container according to the second embodiment of the above-mentioned configuration.

The engagement abutting face 529B is configured by the sloping face towards the container main body opening portion, as approaching inwards of the substrate storing space 27. For this reason, even in a case of the substrate support plate-like portion 5 being stretched in a direction from the back side to the opening side, which is the direction in which the substrate support plate-like portion 5 is detached from the first-side wall 25 (forward direction D11), it is possible to make the locked plate part 527 very hardly move inwards of the substrate storing space 27, which is the direction in which locking of the locked plate part 527 to the narrow-passage forming wall 253 is released. As a result thereof, it is possible to make it very difficult for the substrate support plate-like portion 5 serving as a lateral substrate support part to disconnect from the first-side wall 25.

Figure 11A:
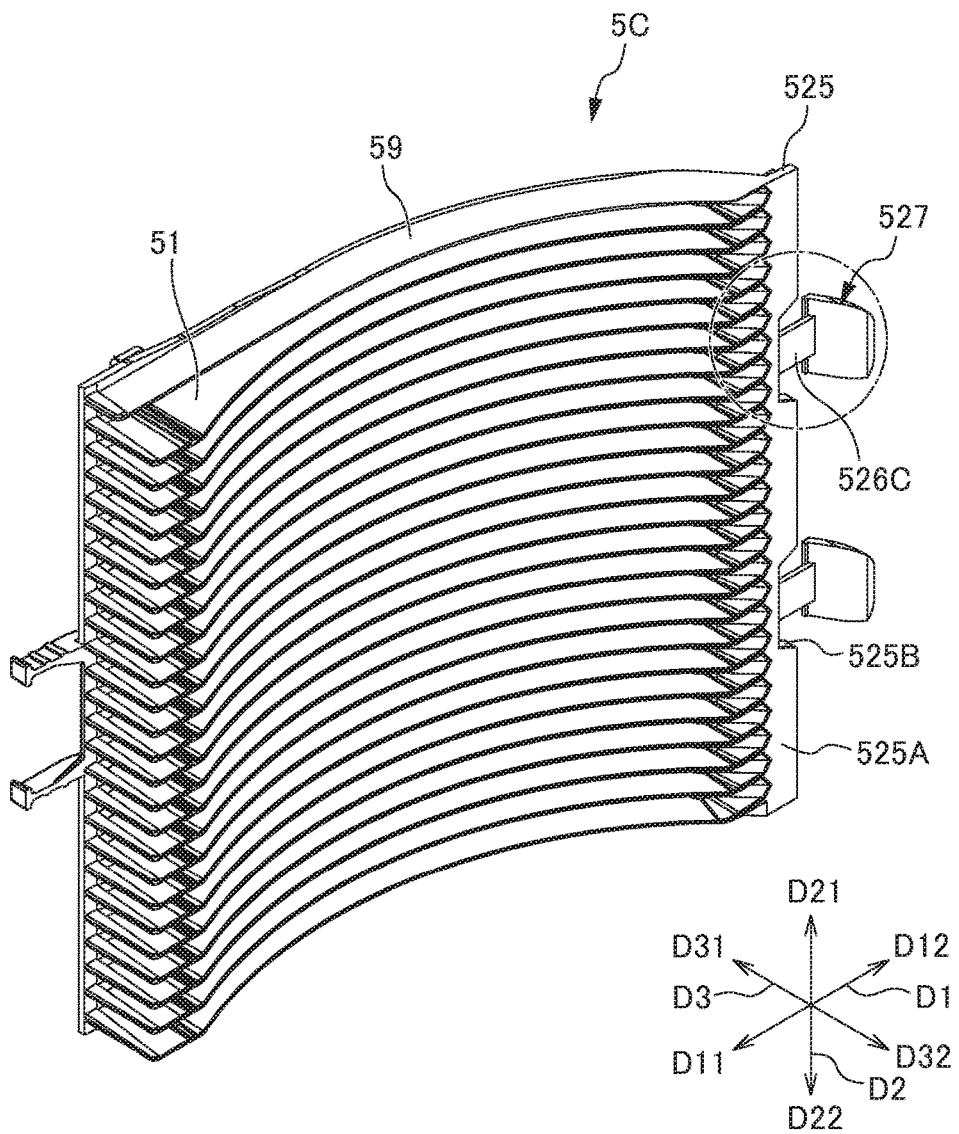
FIG. 11A is a front perspective view showing a substrate support plate-like portion 5C of a substrate support container according to a third embodiment of the present invention.
Figure 11B:
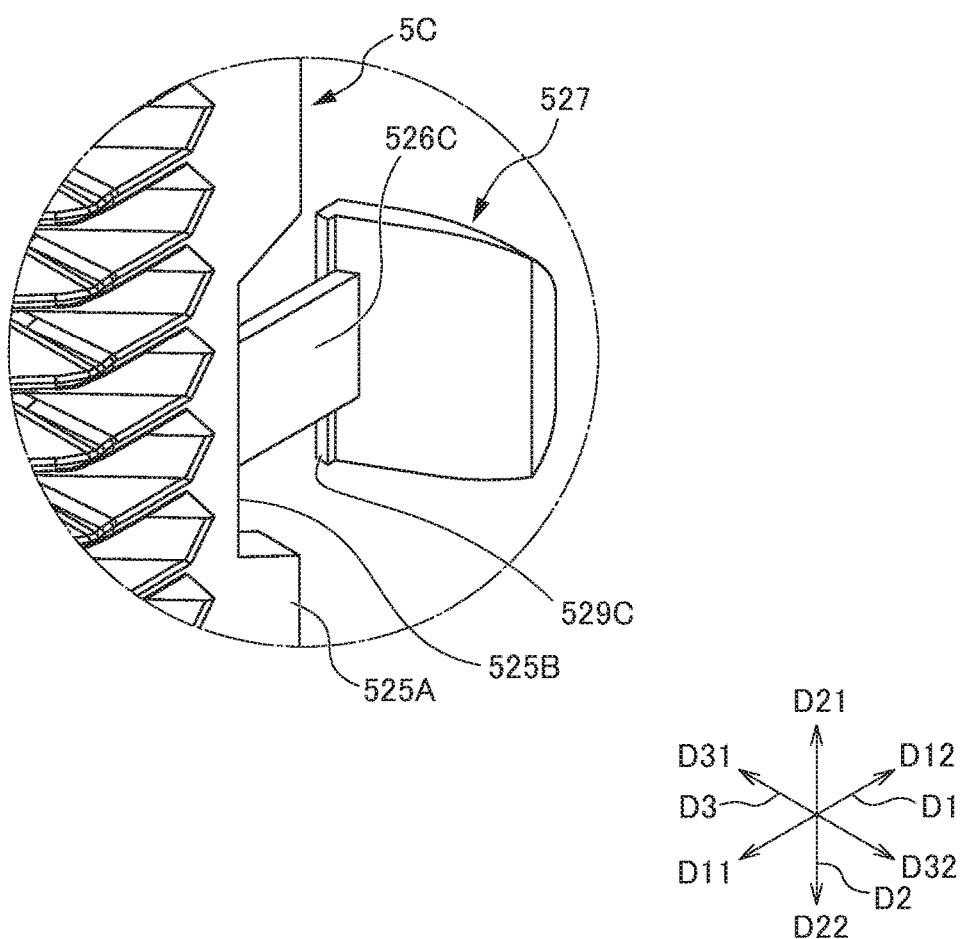
FIG. 11B is an enlarged forward perspective view showing the substrate support plate-like portion 5C of the substrate storing container according to the third embodiment of the present invention.
Figure 11C:
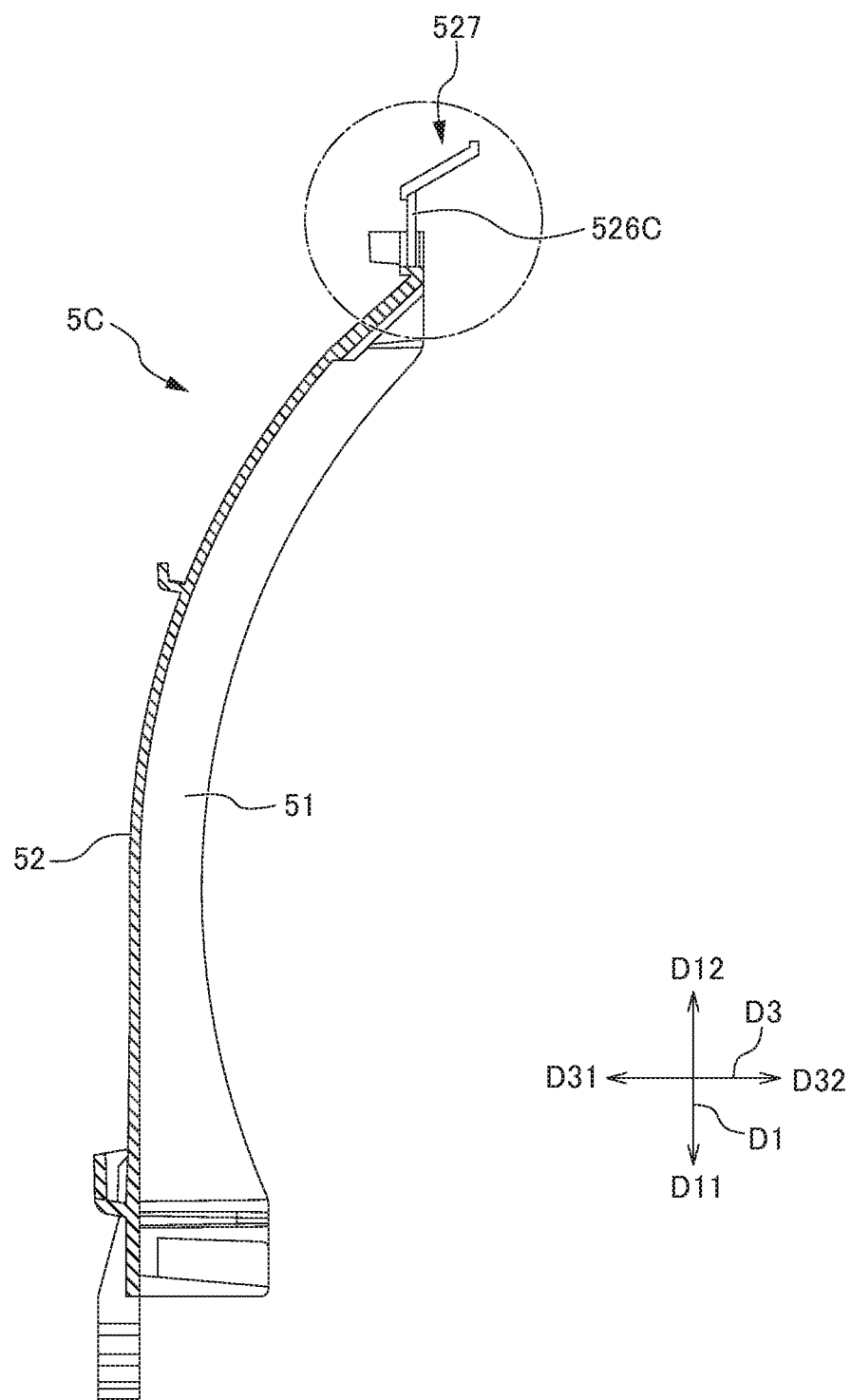
FIG. 11C is a plan cross-sectional view showing the substrate support plate-like portion 5C of the substrate storing container according to the third embodiment of the present invention.
Figure 11D:
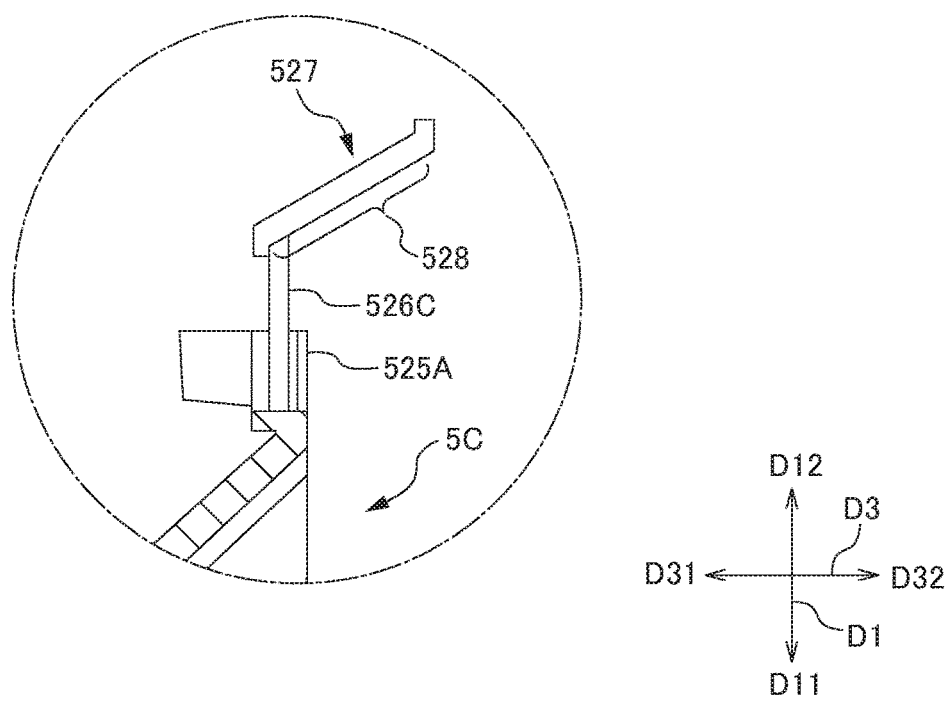
FIG. 11D is an enlarged plan cross-sectional view showing a locked-part extending part 526C and locked plate part 527 of the substrate support plate-like portion 5C of the substrate storing container according to the third embodiment of the present invention.

Next, a substrate storing container according to a third embodiment of the present invention will be explained while referencing FIGS. 11A to 11D. FIG. 11A is a front perspective view showing a substrate support plate-like portion 5C of a substrate storing container 1 according to the third embodiment of the present invention. FIG. 11B is an enlarged front perspective view showing the substrate support plate-like portion 5C of the substrate storing container 1 according to the third embodiment of the present invention. FIG. 11C is a plan cross-sectional view showing the substrate support plate-like portion 5C of the substrate storing container 1 according to the third embodiment of the present invention. FIG. 11D is an enlarged plan cross-sectional view showing a locked-part extending part 526C and locked plate part 527 of the substrate support plate-like portion 5C of the substrate storing container 1 according to the third embodiment of the present invention.

The substrate storing container according to the third embodiment differs from the substrate storing container 1 according to the first embodiment in the point of the locked-part extending part 526C of the substrate support plate-like portion 5C being positioned more outwards of the substrate storing space 27 (right direction D31) than the end face 525A. Configurations similar to the respective configurations of the first embodiment are assigned similar reference symbols, and explanations are omitted.

As shown in FIGS. 11A to 11D, the locked-part extending part 526C is connected by integrally molded with a portion of the end wall 525 constituting the concave portion 525B that is more outwards of the substrate storing space 27 (right direction D31) than the end face 525A. Then, the locked-part extending part 526C extends from the portion of the end wall 525 constituting the concave portion 525B in the backward direction D12, which is the opening direction of the groove 521A. Therefore, as shown in FIG. 11D, etc., the locked-part extending part 526C is positioned more outwards of the substrate storing space 27 (right direction D31) than the end face 525A, without projecting more inwards of the substrate storing space 27 than the end face 525A.

In addition, the extending end of the locked-part extending part 526C is connected by being integrally molded to a wide portion 528 of the locked plate part 527, at a portion positioned at the most front side of the wide portion 528.

The following such effects can be obtained by the substrate storing container according to the third embodiment of the above-mentioned configuration.

The locked-part extending part 526C is positioned more outwards of the substrate storing space 27 than the end face 525A, without projecting more inwards of the substrate storing space 27 than the end face 525A. For this reason, even in a case of the substrate support plate-like portion 5 being stretched in a direction from the back side to the opening side, which is the direction in which the substrate support plate-like portion 5 is detached from the first-side wall 25 (forward direction D11), it is possible to make the locked plate part 527 very hardly move inwards of the substrate storing space 27, which is the direction in which locking of the locked plate part 527 to the narrow-passage forming wall 253 is released. As a result thereof, it is possible to make it very difficult for the substrate support plate-like portion 5C serving as a lateral substrate support part to disconnect from the first-side wall 25.

The present invention is not to be limited to the aforementioned embodiments, and modifications thereto within the technical scope described in the claims are also possible. For example, the shapes and configurations of the substrate storing container 1 are not to be limited to the shapes and configurations of the aforementioned embodiment. More specifically, for example, the engagement abutting face 529 is positioned more outwards of the substrate storing space 27 than the end face 525A; however, it is not limited thereto. For example, the engagement abutting face may have a positional relationship matching the end face 525A, without projecting more inwards of the substrate storing space 27 than the end face 525A.

EXPLANATION OF REFERENCE NUMERALS 1 substrate storing container
2 container main body
3 lid body
5 substrate support plate-like portion (lateral substrate support part)
20 wall portion 21 container main body opening portion
22 back wall
23 upper wall
24 lower wall
25 first-side wall
26 second-side wall
27 substrate storing space
51 plate part
52 support wall (plate-part supporting part)
251 groove-fitting rib
251A positioning groove (positioning part)
253 narrow-passage forming wall (back side locking part)
253A narrow passage
521 groove forming portion
521 groove
522 protrusion
523 alignment rib (positioned part)
524 linear rib
525c square-shaped frame part (end locking part)
526 locked-part extending part
527 locked plate part
529 engagement abutting face
W substrate

The invention claimed is:

1. A substrate storing container, comprising:
a container main body including a tubular wall portion with a container main body opening portion formed at one end portion and the other end portion closed, the wall portion having a back wall, an upper wall, a lower wall, and a pair of side walls, the container main body opening portion being formed by one end portion of the upper wall, one end portion of the lower wall, and one end portions of the side walls, wherein a substrate storing space that can store a plurality of substrates and is in communication with the container main body opening portion is formed by an inner face of the upper wall, an inner face of the lower wall, inner faces of the side walls, and an inner face of the back wall;
a lid body that is removably attached to the container main body opening portion and can close the container main body opening portion;
lateral substrate support parts that are disposed to be fixed to the pair of side walls so as to form a pair inside of the substrate storing space, and can support edge parts of a plurality of substrates when the container main body opening portion is not closed by the lid body, in a state in which adjacent substrates among the plurality of substrates are arranged in parallel to be separated by a predetermined interval,
wherein the lateral substrate support parts include a plurality of plate parts having a parallel positional relationship and supporting the edge parts of the plurality of substrates; and a plate-part support part that supports the plate part and is fixed to the side wall, wherein the plate-part support part includes: a groove forming portion in which a groove that linearly extends over the entirety of the plurality of plate parts in a direction intersecting the plurality of plate parts is formed; a protrusion that is formed inside the groove and projects so as to narrow the width of the groove in a direction orthogonal to an extending direction of the groove, and a positioned part that is formed at a central part of the groove in the extending direction of the groove, and
wherein a groove-fitting rib part that linearly extends to be able to fit in the groove is disposed at an inner face of the side wall, and a positioning part that can engage with the positioned part is disposed at a central part of the groove fitting rib part in an extending direction of the groove-fitting rib part.

2. The substrate storing container according to claim 1, wherein a portion on a back wall side of the side wall has an back side engagement part,
wherein the plate-part supporting part is configured by a plate-like support wall that is connected to a lateral edge of the plate part from one end to another end in a longitudinal direction of the plate part,
wherein the groove forming portion is disposed at an opening-side part that is a portion of the support wall on a side of the container main body opening portion, and
wherein a back side part that is a portion of the support wall on a side of the back wall has a back side locked part that can lock with the back side locking part.

3. The substrate storing container according to claim 2, wherein the back side locked part of the plate-part support part includes:
a locked-part extending part that is elastically deformable and extends in an opening direction of the groove, and
a locked plate part that is formed at an extending end of the locked-part extending part, and is formed to be wider than the locked-part extending part in the extending direction of the groove, and
wherein the back side locking part of the side wall has a narrow-passage forming wall that forms a narrow passage that allows insertion of the locked-part extending portion but does not allow insertion of the locked plate part, and when the locked-part extending part is inserted in the narrow passage, the locked plate part is locked to the narrow-passage forming wall.

4. The substrate storing container according to claim 3, wherein an end of the back side part of the substrate support part has a flat end face that is parallel to a joining direction of the back wall and the container main body opening portion and a joining direction of the upper wall and the lower wall, and
wherein the locked-part extending part has a positional relationship matching the end face, or is positioned more outwards of the substrate storing space than the end face, without projecting more inwards of the substrate storing space than the end face.

5. The substrate storing container according to claim 3, wherein the locked plate part has an engagement abutting face that can abut the narrow-passage forming wall when locked to the narrow-passage forming wall.

6. The substrate storing container according to claim 5, wherein an end of the back side part of the substrate support part has a flat end face that is parallel to a joining direction of the back wall and the container main body opening portion and a joining direction of the upper wall and the lower wall, and
wherein the engagement abutting face has a positional relationship matching the end face, or is positioned more outwards of the substrate storing space than the end face, without projecting more inwards of the substrate storing space than the end face.

7. The substrate storing container according to claim 5, wherein the engagement abutting face is configured from a sloping face towards the container main body opening portion as approaching inwards of the substrate storing space.

8. The substrate storing container according to claim 2, wherein a linear rib having a parallel positional relationship with the groove is disposed at the support wall to oppose over substantially the entirety of the groove.

\* \* \* \* \*